(12) United States Patent
Kwon et al.

(10) Patent No.: US 10,825,934 B2
(45) Date of Patent: Nov. 3, 2020

(54) VERTICAL SEMICONDUCTOR DEVICES

(71) Applicant: SAMSUNG ELECTRONICS CO., LTD., Suwon-si, Gyeonggi-do (KR)

(72) Inventors: Joon-Young Kwon, Hwaseong-si (KR);
Shin-Young Kim, Gunpo-si (KR);
Yoon-Hwan Son, Seoul (KR);
Jae-Jung Lee, Uiwang-si (KR);
Joon-Sung Kim, Hwaseong-si (KR);
Seung-Min Lee, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/735,273

(22) Filed: Jan. 6, 2020

(65) Prior Publication Data

US 2020/0144427 A1  May 7, 2020

Related U.S. Application Data

(63) Continuation of application No. 15/964,207, filed on Apr. 27, 2018, now Pat. No. 10,529,865.

(30) Foreign Application Priority Data

Jul. 31, 2017  (KR) .................. 10-2017-0096992

(51) Int. Cl.
*H01L 29/792* (2006.01)
*H01L 27/11582* (2017.01)
(Continued)

(52) U.S. Cl.
CPC .... *H01L 29/7926* (2013.01); *H01L 27/11565* (2013.01); *H01L 27/11575* (2013.01); *H01L 27/11582* (2013.01); *H01L 29/66545* (2013.01)

(58) Field of Classification Search
CPC .......... H01L 29/7827; H01L 29/66666; H01L 29/7926; H01L 27/11556; H01L 27/11565
See application file for complete search history.

(56) References Cited

U.S. PATENT DOCUMENTS 8,617,996 B1 * 12/2013 Chi ................. H01L 21/30604
257/E21.377
9,368,646 B2  6/2016 Kim et al.
(Continued)

FOREIGN PATENT DOCUMENTS

KR  1020160136919  11/2016

*Primary Examiner* — Zandra V Smith
*Assistant Examiner* — John M Parker
(74) *Attorney, Agent, or Firm* — F. Chau & Associates, LLC

(57) ABSTRACT

A vertical memory device may include a conductive pattern structure, a pad structure, a plurality of channel structures, a plurality of first dummy structures and a plurality of second dummy structures. The conductive pattern structure may be in a first region of a substrate, and may extend in a first direction. The pad structure may be in a second region of the substrate adjacent to each of opposite sides of the first region of the substrate, and may contact a side of the conductive pattern structure. The channel structures may extend through the conductive pattern structure, and may be regularly arranged on the substrate. The first dummy structures may extend through the conductive pattern structure, and may be disposed in a portion of the first region of the substrate adjacent to the second region thereof. The second dummy structures may extend through the pad structure on the substrate. Each of the channel structures may have a first width in the first direction, and each of the first dummy structures may have a second width in the first direction greater than the first width.

20 Claims, 32 Drawing Sheets

(51) Int. Cl.
*H01L 29/66* (2006.01)
*H01L 27/11575* (2017.01)
*H01L 27/11565* (2017.01)

(56) References Cited

U.S. PATENT DOCUMENTS

| | | |
|---|---|---|
| 9,478,561 B2 | 10/2016 | Kim et al. |
| 9,576,967 B1 | 2/2017 | Kimura et al. |
| 9,589,839 B1 | 3/2017 | Ikawa et al. |
| 9,741,733 B2 | 8/2017 | Lim et al. |
| 2010/0090286 A1 | 4/2010 | Lee et al. |
| 2010/0133599 A1 | 6/2010 | Chae et al. |
| 2015/0279971 A1* | 10/2015 | Xie .................. H01L 29/66818 257/401 |
| 2016/0343727 A1 | 11/2016 | Kim et al. |
| 2017/0047334 A1 | 2/2017 | Lu et al. |
| 2017/0084532 A1 | 3/2017 | Son et al. |
| 2017/0092654 A1 | 3/2017 | Nishikawa et al. |
| 2017/0117289 A1 | 4/2017 | Liu et al. |
| 2017/0125538 A1 | 5/2017 | Sharangpani et al. |
| 2018/0090491 A1 | 3/2018 | Huang et al. |
| 2018/0366482 A1* | 12/2018 | Zhou ................. H01L 27/11524 |
| 2019/0035942 A1 | 1/2019 | Kwon et al. |

\* cited by examiner

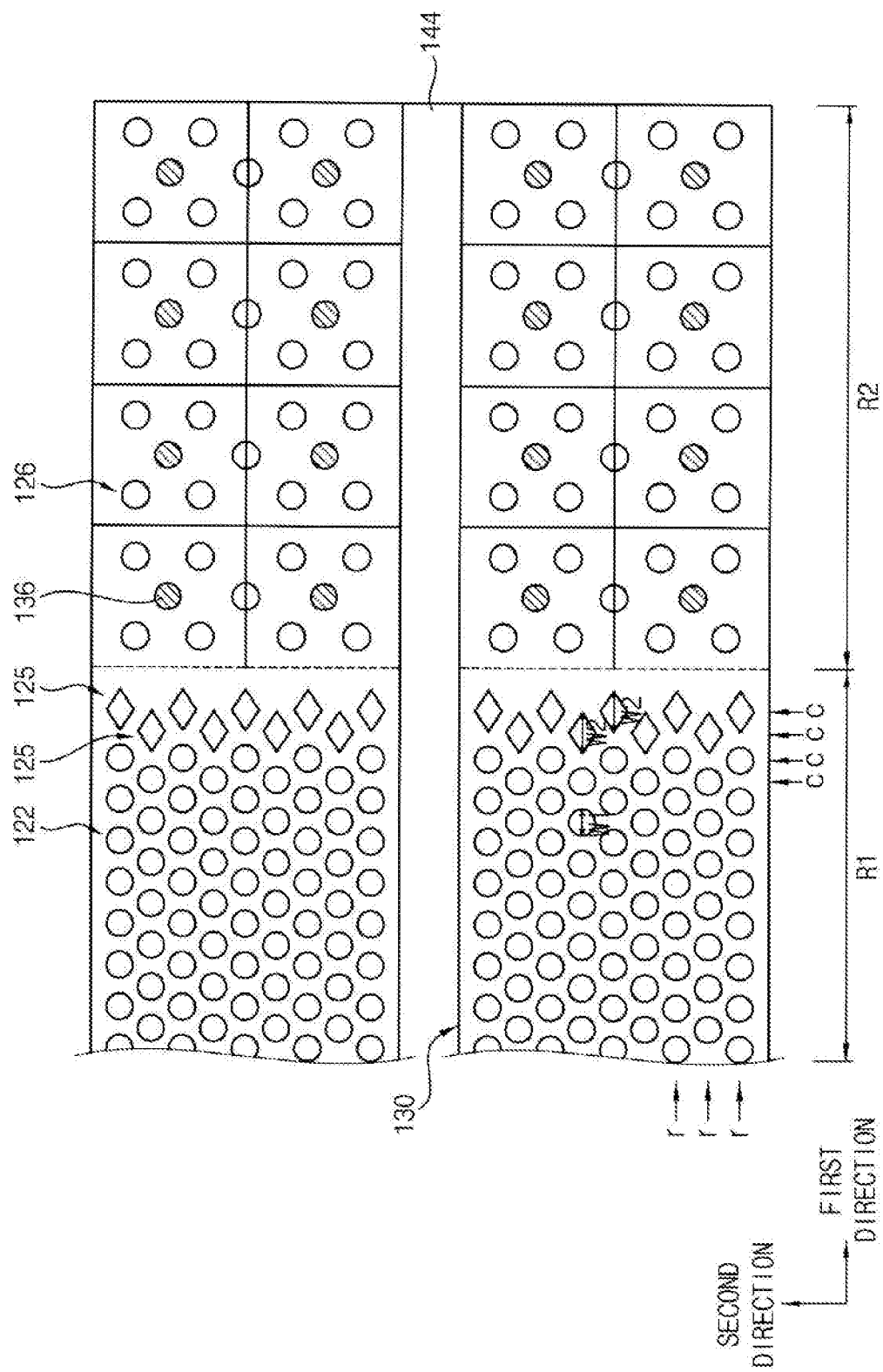

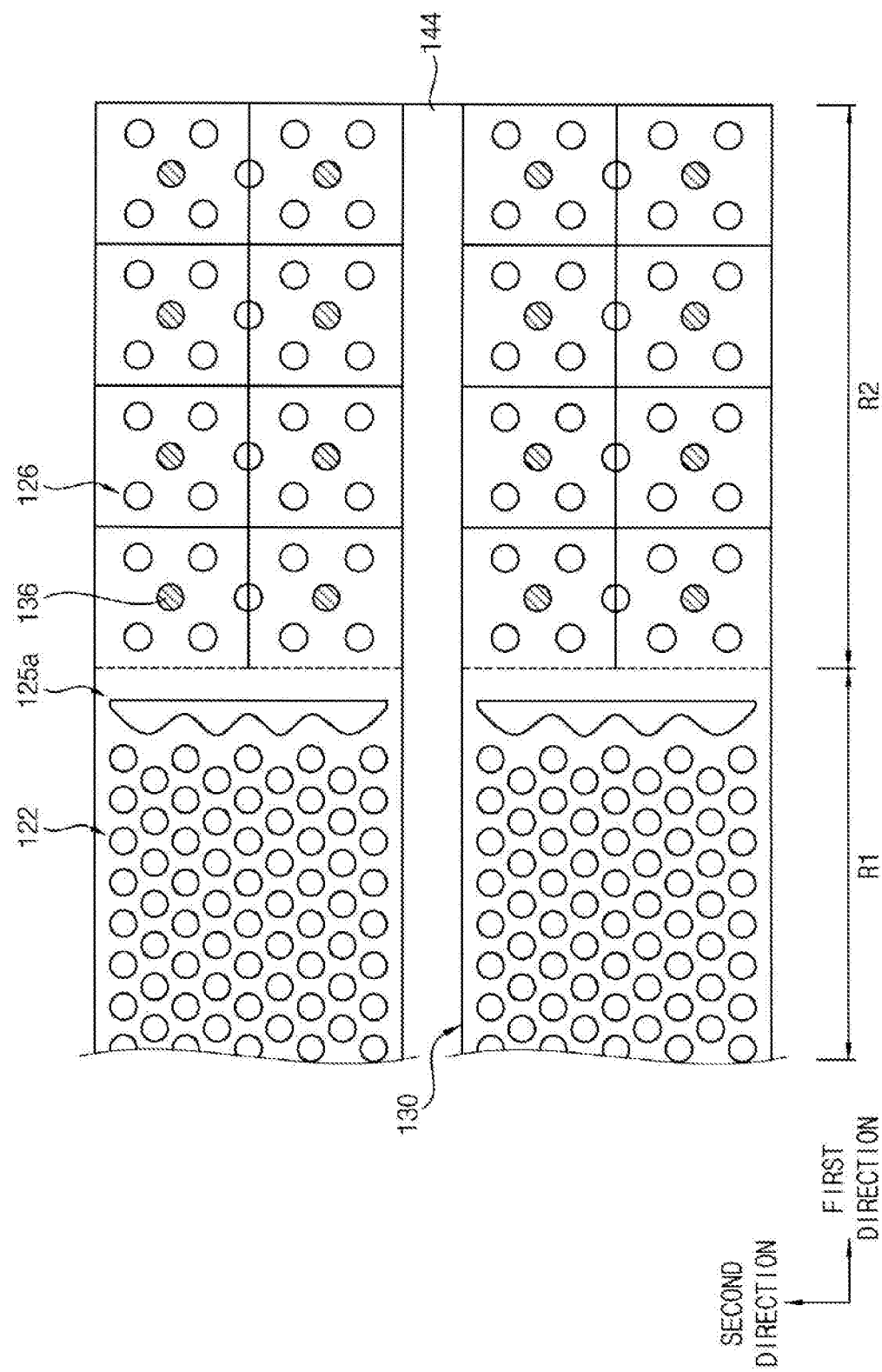

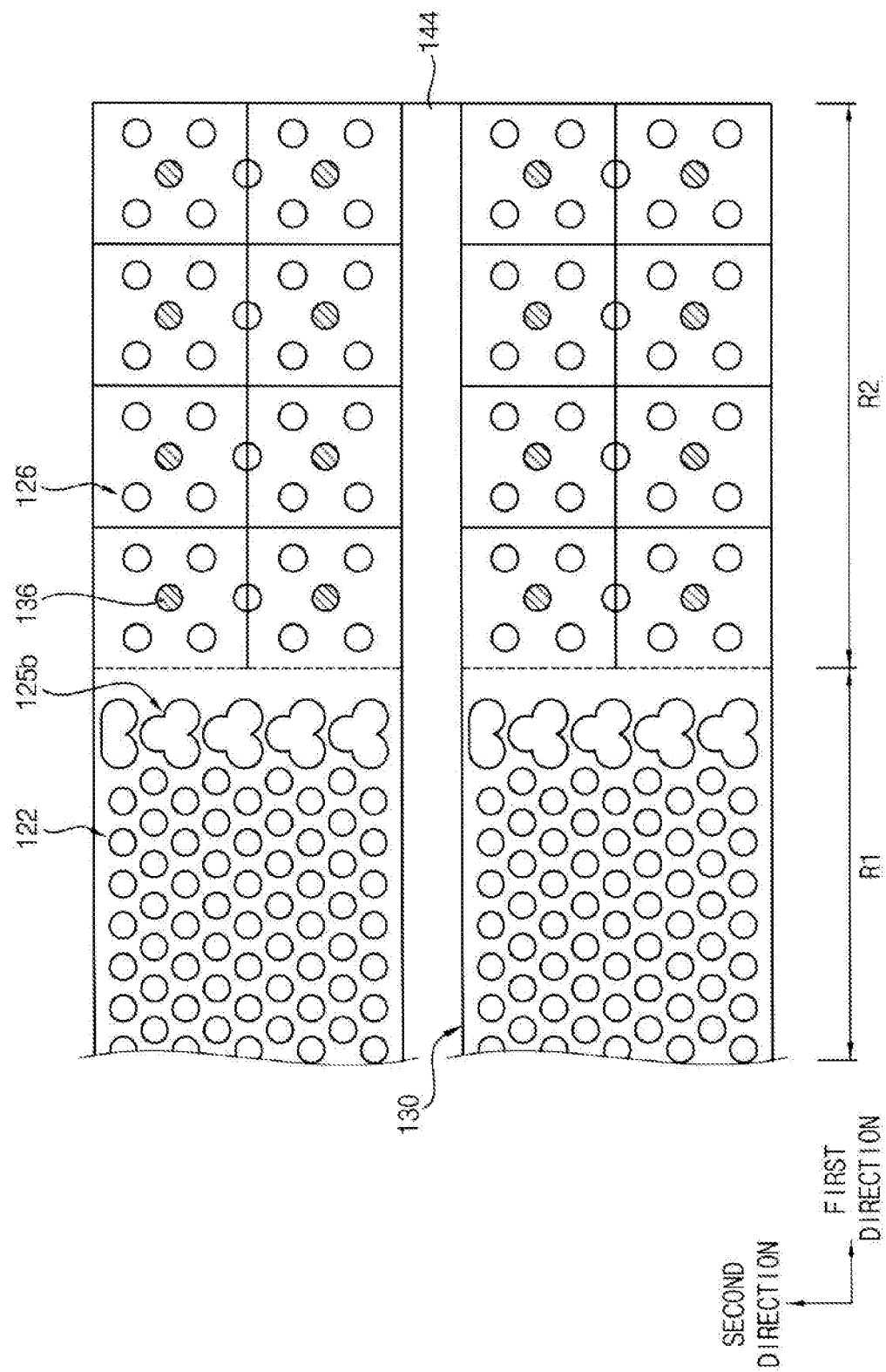

VERTICAL SEMICONDUCTOR DEVICES

CROSS-REFERENCE TO RELATED APPLICATION

This application is a continuation of U.S. application Ser. No. 15/964,207 filed on Apr. 27, 2018, which claims priority under 35 U.S.C. § 119 to Korean Patent Application No. 10-2017-0096992, filed on Jul. 31, 2017, in the Korean Intellectual Property Office (KIPO), the contents of which are incorporated by reference herein in their entirety.

TECHNICAL FIELD

Example embodiments relate to vertical semiconductor devices, and more particularly, relate to vertical NAND flash memory devices.

DISCUSSION OF RELATED ART

A vertical semiconductor device may include a plurality of memory cells vertically stacked at a plurality of levels, respectively. As the number of vertically stacked memory cells included in the vertical semiconductor device increases, it is not easy to form the memory cells without the concern of increasing electrical failures.

SUMMARY

Example embodiments of the present inventive concept provide a vertical semiconductor device with reduced electrical failures.

According to an example embodiment of the present inventive concept, there is provided a vertical memory device that may include a conductive pattern structure, a pad structure, a plurality of channel structures, a plurality of first dummy structures and a plurality of second dummy structures. The conductive pattern structure may be formed in a first region of a substrate, and may extend in a first direction. The pad structure may be formed in a second region of the substrate adjacent to each of opposite sides of the first region of the substrate, and may contact a side of the conductive pattern structure. The plurality of channel structures may extend through the conductive pattern structure, and may be regularly arranged on the substrate. The plurality of first dummy structures may extend through the conductive pattern structure, and may be disposed in a portion of the first region of the substrate adjacent to the second region thereof. The plurality of second dummy structures may extend through the pad structure on the substrate. Each of the plurality of channel structures may have a first width in the first direction, and each of the plurality of first dummy structure may have a second width in the first direction greater than the first width.

According to an example embodiment of the present inventive concept, there is provided a vertical memory device that may include a conductive pattern structure, a pad structure, a plurality of channel structures, a plurality of first dummy structures and a plurality of second dummy structures. The conductive pattern structure may be formed in a first region of a substrate, and may extend in a first direction. The pad structure may be formed in a second region of the substrate adjacent to each of opposite sides of the first region of the substrate, and may contact a side of the conductive pattern structure. The plurality of channel structures may extend through the conductive pattern structure, and may be regularly arranged on the substrate. The plurality of first dummy structures may extend through the conductive pattern structure, and may be disposed in a portion of the first region of the substrate adjacent to the second region thereof. The plurality of second dummy structures may extend through the pad structure on the substrate. Neighboring ones of the plurality of channel structures in the first direction may have a first pitch, and ones of the plurality of channel structures and ones of the plurality of first dummy structures adjacent to each other in the first direction may have a second pitch greater than the first pitch.

According to an example embodiment of the present inventive concept, there is provided a vertical memory device that may include a conductive pattern structure, a pad structure, a plurality of channel structures, a plurality of first dummy structures and a plurality of second dummy structures. The conductive pattern structure may be formed in a first region of a substrate, and may extend in a first direction. The pad structure may be formed in a second region of the substrate adjacent to each of opposite sides of the first region of the substrate, and may contact a side of the conductive pattern structure. The plurality of channel structures may extend through the conductive pattern structure, and may be regularly arranged on the substrate. The plurality of first dummy structures may extend through the conductive pattern structure, and may be disposed in a portion of the first region of the substrate adjacent to the second region thereof. An upper surface of each of the plurality of first dummy structures may have a shape different from a shape of an upper surface of each of the plurality of channel structures. The plurality of second dummy structures may extend through the pad structure on the substrate.

BRIEF DESCRIPTION OF THE DRAWINGS

Example embodiments of the present inventive concept will be more clearly understood from the following detailed description taken in conjunction with the accompanying drawings, in which:

FIG. 30 is a plan view illustrating a vertical semiconductor device in accordance with an example embodiment of the present inventive concept;

FIG. 31 is a plan view illustrating a vertical semiconductor device in accordance with an example embodiment of the present inventive concept; and FIG. 32 is a plan view illustrating a vertical semiconductor device in accordance with an example embodiment of the present inventive concept.

Figure 1:
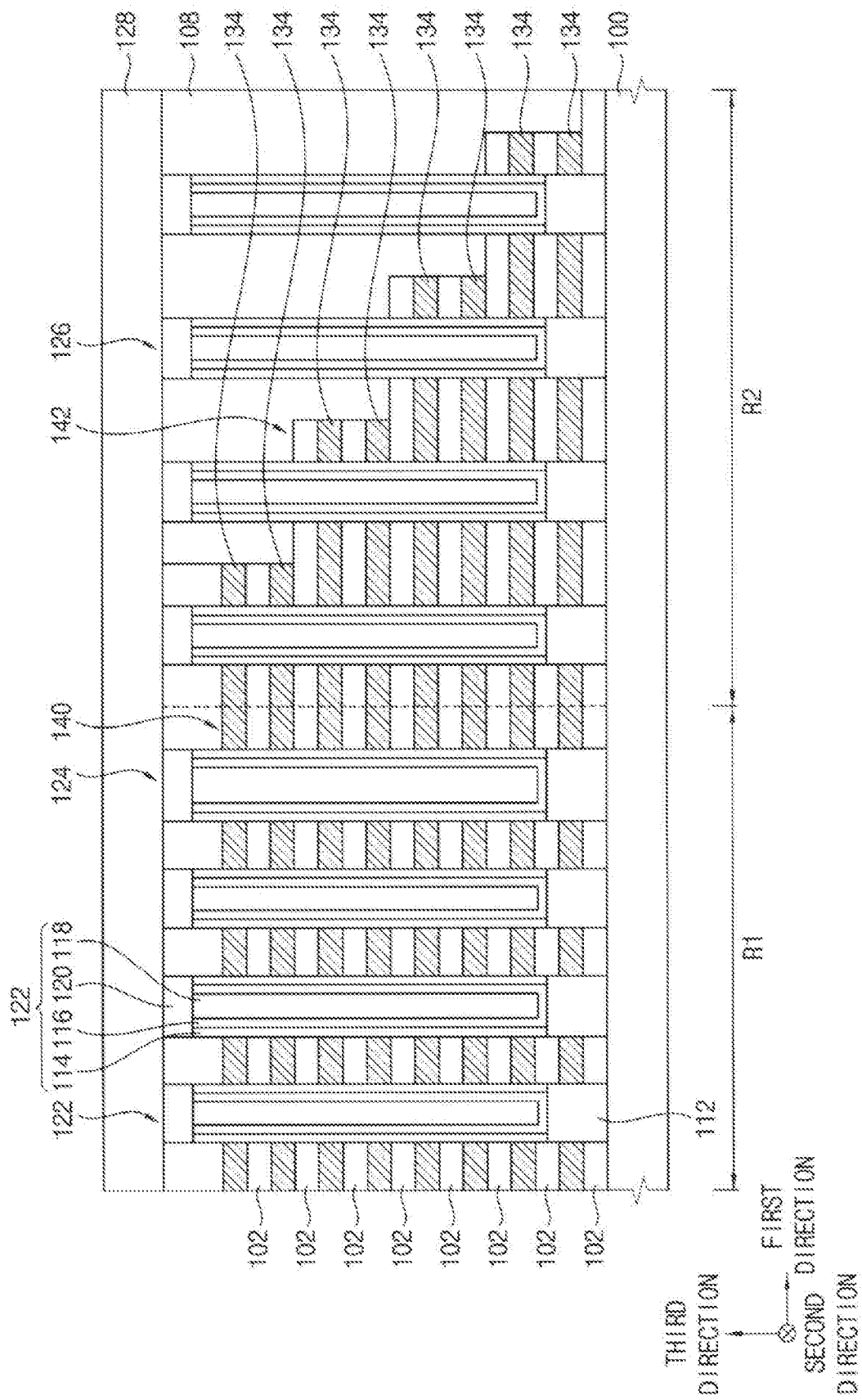
FIGS. 1 and 2 are a cross-sectional view and a plan view, respectively, illustrating a vertical semiconductor device in accordance with an example embodiment of the present inventive concept.

Since the drawings in FIGS. 1-32 are intended for illustrative purposes, the elements in the drawings are not necessarily drawn to scale. For example, some of the elements may be enlarged or exaggerated for clarity purpose.

DESCRIPTION OF EMBODIMENTS

Figure 2:
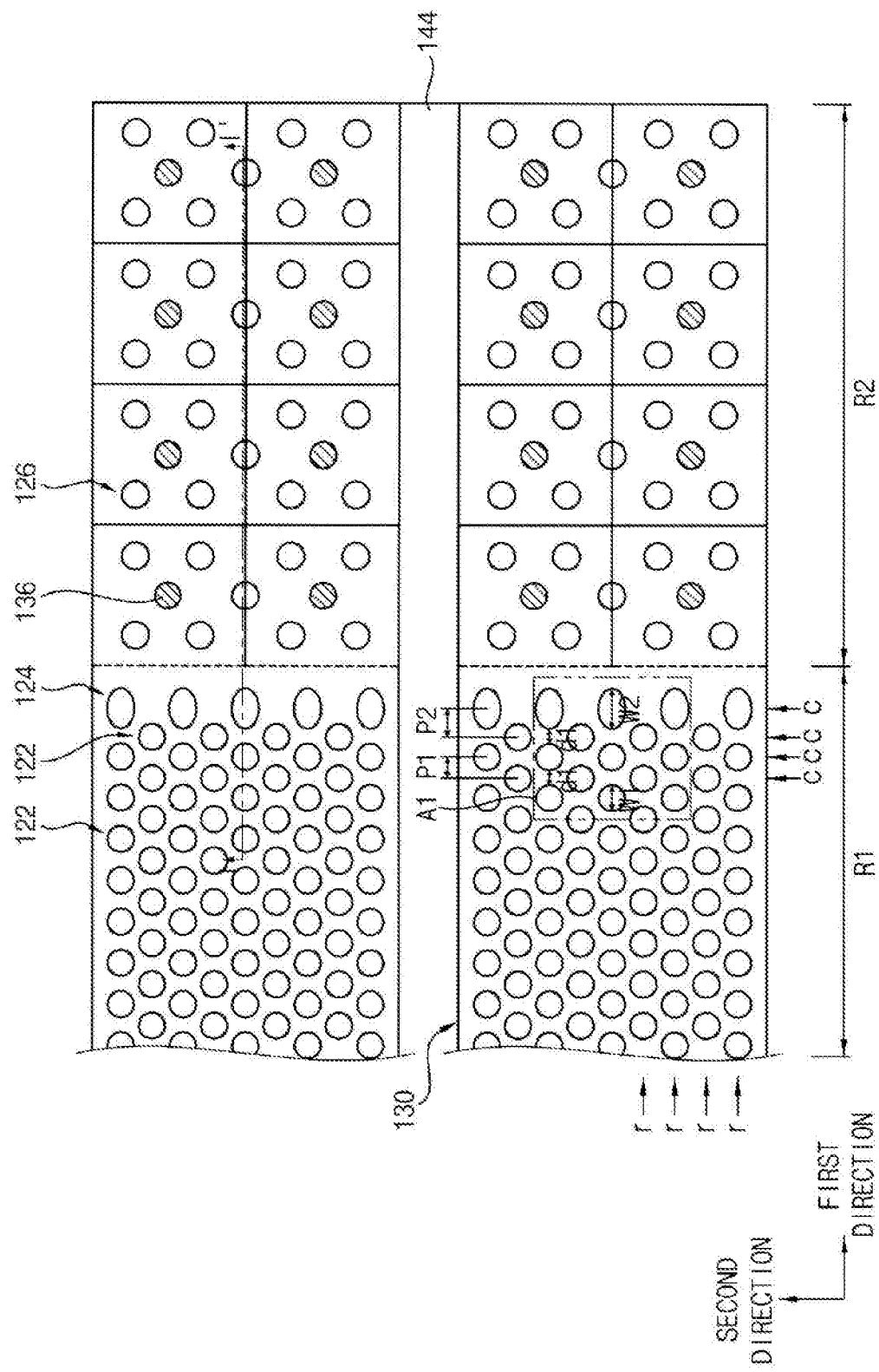
Figure 3:
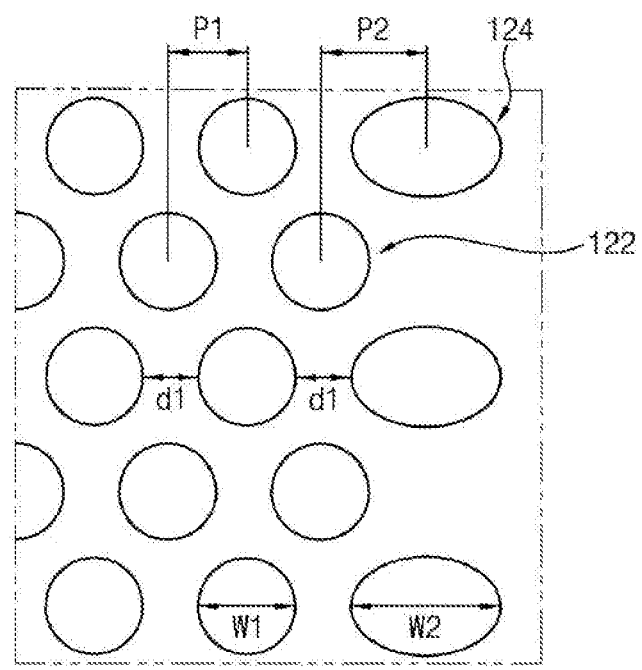
FIG. 3 is an enlarged plan view of a portion 'A1' in FIG. 2.

FIGS. 1 and 2 are a cross-sectional view and a plan view, respectively, illustrating a vertical semiconductor device in accordance with an example embodiment of the present inventive concept. FIG. 3 is an enlarged plan view of a portion 'A1' in FIG. 2. FIG. 1 is a cross-sectional view taken along line I-I' of FIG. 2.

Referring to FIGS. 1, 2 and 3, a substrate 100 may include a first region R1 in which memory cells may be formed in three dimensions, and a second region R2 in which wirings connected to the memory cells may be formed. The memory cells may be vertically stacked on the substrate 100 in the first region R1.

A conductive pattern structure 140, a channel structure 122 and a first dummy structure 124 may be formed in the first region R1. A pad structure 142, a second dummy structure 126 and a contact plug 136 may be formed in the second region R2.

The substrate 100 may be a semiconductor substrate, and may include, e.g., a silicon (Si) substrate, a germanium (Ge) substrate, a silicon-germanium (SiGe) substrate, or a silicon on insulator (SOI) substrate.

First, the conductive pattern structure 140 of the first region R1 will be described.

The conductive pattern structure 140 may include conductive patterns 134 and insulation layers 102 alternately and repeatedly stacked on each other on the substrate 100. The conductive patterns 134 may be spaced apart from each other in a third direction substantially perpendicular to an upper surface of the substrate 100, i.e., substantially perpendicular to a first direction and a second direction. The conductive patterns 134 may be electrically separated from each other by the insulating layers 102.

The conductive pattern structure 140 may extend in the first direction. In an example embodiment of the present inventive concept, a plurality of conductive pattern structures 140 may be spaced apart from each other in the second direction substantially perpendicular to the first direction.

The conductive patterns 134 in the conductive pattern structure 140 may include a ground selection line (GSL), a string selection line (SSL) and a plurality of word lines between the GSL and SSL. The GSL may be the lowermost of the conductive patterns 134, and the closest to the substrate 100.

The conductive pattern 134 may include a metal. In an example embodiment of the present inventive concept, the conductive pattern 134 may include a metal pattern and a barrier pattern. The metal pattern may include at least one of, e.g., tungsten (W), copper (Cu), cobalt (Co), aluminum (Al), etc., and the barrier pattern may include at least one of, e.g., titanium (Ti), titanium nitride (TiN), tantalum (Ta), tantalum nitride (TaN), etc.

Hereinafter, the pad structure 142 in the second region R2 will be described.

The pad structure 142 may contact each of opposite ends of the conductive pattern structure 140 in the first direction, and the conductive pattern structure 140 and the pad structure 142 may be merged into a single body extending in the first direction. For example, the pad structure 142 in the second region R2 of the substrate 100 may be adjacent to each of opposite sides of the first region R1 of the substrate 100, and may contact a side of the conductive pattern structure 140.

The pad structure 142 may include the conductive patterns 134 and the insulation layers 102 alternately and repeatedly stacked on each other. That is, the conductive patterns 134 in the pad structure 142 and the conductive patterns 134 in the conductive pattern structure 140 may be merged into a single body including substantially the same material. Also, the insulation layers 102 in the pad structure 142 and the insulation layers 102 in the conductive pattern structure 140 may be merged into a single body including substantially the same material.

In an example embodiment of the present inventive concept, the pad structure 142 may have a staircase shape. That is, edge portions of the conductive patterns 134 in the first direction may have a staircase shape, so that the conductive patterns 134 may have different levels in the third direction. Each of the edge portions of the conductive patterns 134 may be a portion of a conductive pattern 134 not vertically overlapped by another conductive pattern 134 immediately above. In other words, the lengths of the conductive patterns 134 in the first direction may be greater as the conductive patterns 134 are closer to the substrate 100. The edge portions of the conductive patterns 134 having the different levels may serve as pads on which contact plugs may be formed, respectively. In an example embodiment of the present inventive concept, the number of the pads in the pad structure 142 may be substantially the same as the number of the stacked conductive patterns 134 in the conductive pattern structure 140.

In an example embodiment of the present inventive concept, the pad structure 142 may include step portions in each of the first and second directions. For example, the pad structure 142 may include a plurality of steps disposed at a plurality of levels, respectively, in the first direction, and a plurality of steps disposed at a plurality of sub-levels, respectively, in each level in the second direction.

A first upper insulating interlayer 108 may cover the pad structure 142 in the second region R2. A second upper insulating interlayer 128 may be formed on the first upper insulating interlayer 108 and the conductive pattern structure 140 in the second and first regions R2 and R1, respectively.

An upper surface of each of the first and second upper insulating interlayers 108 and 128 may be substantially flat.

The channel structure 122 and the first dummy structure 124 may extend in the third direction through the conductive pattern structure 140 in the first region R1, and may have a pillar shape. The first dummy structure 124 may be disposed in an edge portion of the first region R1 adjacent to the second region R2. The second dummy structure 126 may extend in the third direction through the first upper insulating interlayer 108 and the pad structure 142 in the second region R2, and may have a pillar shape.

In an example embodiment of the present inventive concept, the channel structure 122 may be formed in a channel hole extending in the third direction through the conductive pattern structure 140 and exposing an upper surface of the substrate 100 in the first region R1. The first dummy structure 124 may be formed in a first dummy hole extending in the third direction through the conductive pattern structure 140 and exposing an upper surface of the substrate 100 in an edge portion of the first region R1 adjacent to the second region R2. The second dummy structure 126 may be formed in a second dummy hole extending in the third direction through the first upper insulating interlayer 108 and the pad structure 142 and exposing an upper surface of the substrate 100. In an example embodiment of the present inventive concept, the formation of the channel hole, the first dummy hole and the second dummy hole, and the formation of the channel structure 122, the first dummy structure 124 and the second dummy structure 126 may each be performed simultaneously. Alternatively, the channel hole, the first dummy hole and the second dummy hole may be formed separately, and/or the channel structure 122, the first dummy structure 124 and the second dummy structure 126 may be formed separately in the process of fabricating the vertical semiconductor device.

In an example embodiment of the present inventive concept, semiconductor patterns 112 may be further formed at lower portions of the channel hole, the first dummy hole and the second dummy hole, respectively. The semiconductor patterns 112 may be formed between the substrate 100 and the channel structure 122, between the substrate 100 and the first dummy structure 124, and between the substrate 100 and the second dummy structure 126. Each of the channel structure 122, the first dummy structure 124 and the second dummy structure 126 may be formed on the semiconductor pattern 112, but the present inventive concept is not limited thereto. For example, in an example embodiment of the present inventive concept, each of the channel structure 122, the first dummy structure 124 and the second dummy structure 126 may directly contact the substrate 100.

The channel structure 122 and the first and second dummy structures 124 and 126 may have substantially the same stacked structure. In an example embodiment of the present inventive concept, each of the channel structure 122 and the first and second dummy structures 124 and 126 may include a dielectric structure 114, a channel 116, a filling insulation pattern 118 and an upper conductive pattern 120. However, the present inventive concept is not limited thereto. For example, within the stacked structures of the channel structure 122, the first dummy structure 124 and the second dummy structure 126, any two of them may be substantially the same, or all three are different from each other. For example, the channel structure 122 and the first dummy structure 124 may have substantially the same stacked structure, but the substantially same stacked structure of the channel structure 122 and the first dummy structure 124 may be different from the stacked structure of the second dummy structure 126.

In an example embodiment of the present inventive concept, the channel 116 may have a hollow cylindrical shape or a cup-like shape. The channel 116 may include polycrystalline silicon (polysilicon) or single crystalline silicon. A portion of the channel 116 may be doped with p-type impurities, e.g., boron (B). The filling insulation pattern 118 may be formed on the channel 116 to fill an inner space of the channel 116. The filling insulation pattern 118 may include an insulation material, e.g., silicon oxide ($SiO_2$). In an example embodiment of the present inventive concept, the channel 116 may have a solid cylindrical shape or a pillar shape, and in this case, the filling insulation pattern 118 may not be formed. The dielectric structure 114 may surround an outer sidewall of the channel 116. The dielectric structure 114 may include a tunnel insulation layer, a charge storage layer and a blocking dielectric layer sequentially stacked on the outer sidewall of the channel 116. The blocking dielectric layer may include an oxide, e.g., silicon oxide ($SiO_2$), or a metal oxide, e.g., hafnium oxide ($HfO_2$) or aluminum oxide ($Al_2O_3$). The charge storage layer may include a nitride, e.g., silicon nitride ($Si_3N_4$), or a metal oxide, e.g., hafnium oxide ($HfO_2$) or aluminum oxide ($Al_2O_3$). The tunnel insulation layer may include an oxide, e.g., silicon oxide ($SiO_2$). The dielectric constant of the material included in the blocking dielectric layer may be higher than the dielectric constant of the material included in the tunnel insulation layer. The upper conductive pattern 120 may be formed at an upper portion of each of the channel hole, the first dummy hole and the second dummy hole. That is, the upper conductive pattern 120 may be formed on the dielectric structure 114, the channel 116 and the filling insulation pattern 118.

The semiconductor pattern 112 may include, e.g., polysilicon or single crystalline silicon.

Hereinafter, the channel structure 122 and the first and second dummy structures 124 and 126 will be described with reference to FIGS. 2 and 3.

A plurality of channel structures 122 may be regularly arranged. In an example embodiment of the present inventive concept, the channel structures 122 disposed at each of rows may be arranged linearly in the first direction. The channel structures 122 disposed at even and odd rows may be arranged in a zig-zag fashion in the second direction as shown in the plan views of the vertical semiconductor device illustrated in FIGS. 2 and 3.

An upper surface of the channel structure 122 may have a circular shape having a diameter of a first width W1. The channel structures 122 may be spaced apart from each other in the first direction by a first distance d1. A distance between center portions of adjacent structures disposed at neighboring columns is defined as a pitch. The channel structures 122 may be disposed to have a first pitch P1.

In an example embodiment of the present inventive concept, the conductive pattern structure 140 and the channel structure 122 may form memory cells.

In an example embodiment of the present inventive concept, most of the conductive pattern structures 140 and the channel structures 122 may form memory cells. However, some of the channel structures 122 adjacent to the first dummy structure 124 may form dummy cells that may not be electrically operated.

A plurality of first dummy structures 124 may be arranged in a portion of the first region R1 adjacent to the second region R2. In an example embodiment of the present inventive concept, the first dummy structures 124 may be disposed in the first region R1 between a boundary of the second region R2 and a column (arranged in the second direction) of the channel structures 122 closest to the boundary of the second region R2. The first dummy structures 124 may be aligned in the second direction. The first dummy structures 124 and the channel structures 122 adjacent to the first dummy structures 124 may be arranged in a zig-zag fashion in the second direction. For example, the first dummy structures 124 and the channel structures 122 from each of the two adjacent columns closest to the boundary of the second region R2, respectively, may be arranged in a zig-zag fashion in the second direction as shown in the plan views of the vertical semiconductor device illustrated in FIGS. 2 and 3.

The first dummy structure 124 and the channel structure 122 adjacent to the first dummy structure 124 may be disposed to have a second pitch P2 different from the first pitch P1. The second pitch P2 is defined as the distance between the center portion of the first dummy structure 124 and the center portion of the adjacent channel structure 122 of the neighboring column in the first direction. In an example embodiment of the present inventive concept, the second pitch P2 may be greater than the first pitch P1. An arrangement and a shape of the first dummy structures 124 may be different from an arrangement and a shape of the channel structures 122. For example, in a plan view, the shape of the first dummy structure 124 may be different from the shape of the channel structure 122.

An upper surface of the first dummy structure 124 may have an elliptical shape having a length in the first direction longer than a length of an upper surface of the channel structure 122. In an example embodiment of the present inventive concept, the upper surface of the first dummy structure 124 may have a second width W2 in the first direction greater than the first width W1, and have the first width W1 in the second direction. For example, the upper surface of the first dummy structure 124 may have an elliptical shape of which the major axis may have the second width W2 in the first direction, and the minor axis may have the first width W1 in the second direction.

The first dummy structure 124 and the channel structure 122 may be spaced apart from each other in the first direction by the first distance d1. As the upper surface of the first dummy structure 124 may have the second width W2 in the first direction greater than the first width W1, the second pitch P2 may be greater than the first pitch P1.

The first dummy structure 124 and the channel structure 122 may have substantially the same stacked structure. However, electrical signals are not applied via the first dummy structure 124, so that the conductive pattern structure 140 and the first dummy structure 124 may not form actual memory cells.

A plurality of second dummy structures 126 may be spaced apart from each other by a distance greater than the first distance d1. Thus, a density of the second dummy structures 126 may be lower than a density of the channel structure 122 and a density of the first dummy structure 124. Also, the second dummy structures 126 may be disposed to have a pitch greater than the second pitch P2.

The second dummy structure 126 may serve as a support pattern for supporting the wiring structure.

As described above, the channel structures 122 may be disposed to have the first pitch P1 The first dummy structure 124 and the channel structure 122 adjacent to the first dummy structure 124 may be disposed to have the second pitch P2. The second dummy structures 126 may be disposed to have a pitch greater than the second pitch P2.

The first dummy structure 124 and the channel structure 122 may share the conductive pattern structure 140 serving as elements of the actual memory cells. Thus, when the first dummy structure 124 has defects, electrical failure may occur at the actual memory cells via the conductive pattern structure 140 shared by the first dummy structure 124.

The first dummy structures 124 may be adjacent to the second dummy structures 126 which have a density greatly different from a density of the channel structures 122. Although the first dummy structures 124 are intended to have the arrangement and/or the shape substantially the same as the arrangement and/or the shape of the channel structures 122, the first dummy structures 124 may be formed to have the shape different from the shape of the channel structures 122. For example, a first dummy hole for forming the first dummy structure 124 and a channel hole for forming the channel structure 122 may be formed by performing a photolithography process using the same reticle. In this case, the channel hole may be normally formed. However, the first dummy hole may not expose the upper surface of the substrate 100, or the first dummy hole may have a width smaller than a width of the channel hole. For example, through the photolithography process, the first dummy hole may not be sufficiently opened to form a normal hole, while the channel hole is normally formed. When the first dummy hole does not expose the upper surface of the substrate 100, which may be referred to as a not-open failure, or has a small width, the semiconductor pattern 112 may not be formed, or layers included in the first dummy structure 124 may not be normally formed.

As the first dummy structure 124 and the channel structure 122 adjacent to the first dummy structure 124 is disposed to have the second pitch P2, the not-open failure of the first dummy hole may decrease when forming the first dummy structure 124. Thus, failures of the first dummy structure 124 may decrease. When the first dummy structure 124 has reduced defects, electrical failures caused by these defects at the actual memory cells via the conductive pattern structure 140 shared by the first dummy structure 124 may also be reduced.

A contact plug 136 (refer to FIG. 2) may be formed through the first and second upper insulating interlayers 108 and 128 on each of the conductive patterns 134 in the pad structure 142. At least one of the contact plugs 136 may be formed on the upper surface of each of the conductive patterns 134 in the pad structure 142. In an example embodiment of the present inventive concept, the contact plug 136 may include a barrier pattern and a metal pattern. The metal pattern may include at least one of, e.g., tungsten (W), copper (Cu), cobalt (Co), aluminum (Al), etc., and the barrier pattern may include at least one of, e.g., titanium (Ti), titanium nitride (TiN), tantalum (Ta), tantalum nitride (TaN), etc.

A wiring line may be formed on the contact plug 136.

Figure 4:
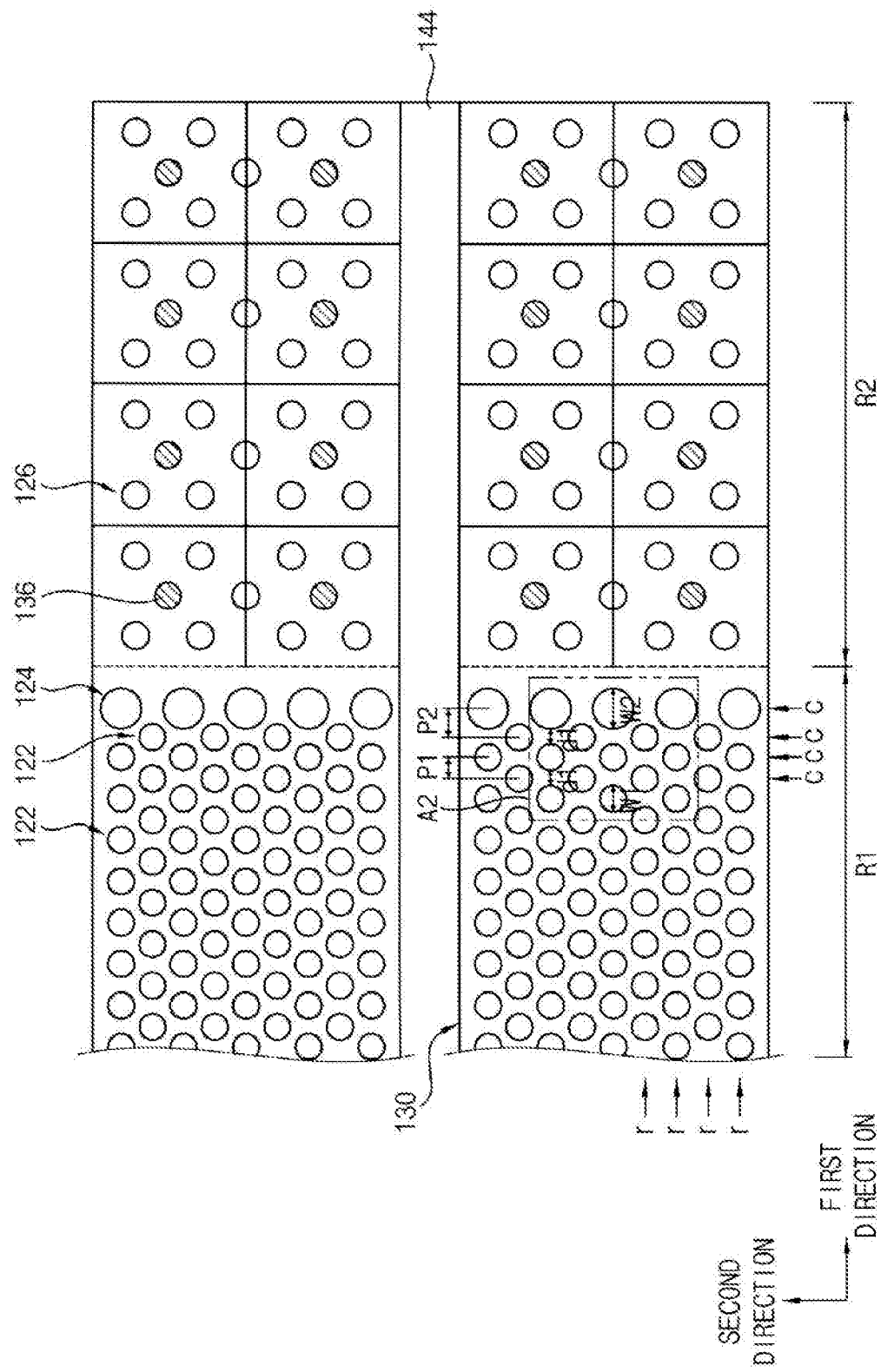
FIG. 4 is a plan view illustrating a vertical semiconductor device in accordance with an example embodiment of the present inventive concept.
Figure 5:
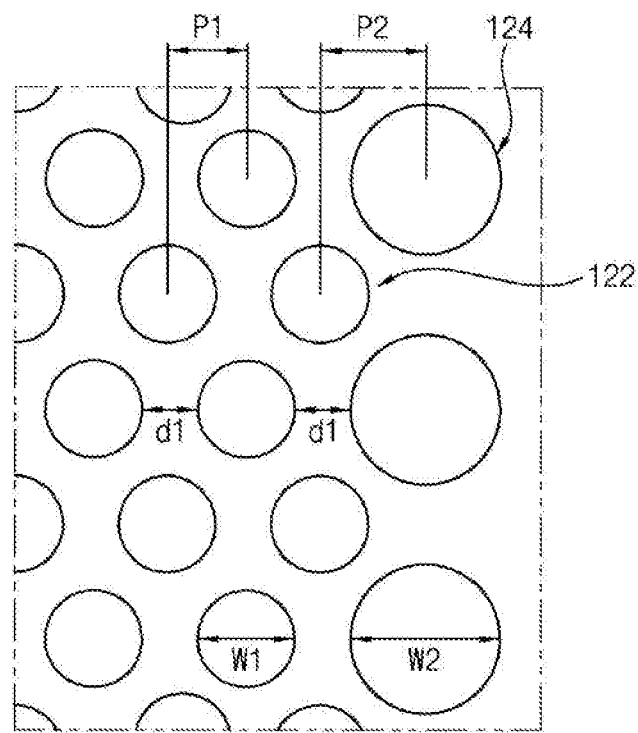
FIG. 5 is an enlarged plan view of a portion 'A2' in FIG. 4.

FIG. 4 is a plan view illustrating a vertical semiconductor device in accordance with an example embodiment of the present inventive concept. FIG. 5 is an enlarged plan view of a portion 'A2' in FIG. 4.

The vertical semiconductor device illustrated in FIGS. 4 and 5 may be substantially the same as the vertical semiconductor device illustrated with reference to FIGS. 1 to 3, except for the shape and/or size of the first dummy structure.

Referring to FIGS. 4 and 5, a plurality of first dummy structures 124 may be formed in the first region R1 between a boundary of the second region R2 and a column of the channel structures 122 closest to the boundary of the second region R2. The first dummy structure 124 and the channel structure 122 adjacent to the first dummy structure 124 may be disposed to have the second pitch P2 different from the first pitch P1 The first dummy structure 124 and the channel structure 122 adjacent to the first dummy structure 124 may have shapes different from each other, or may have the same shape but with sizes different from each other.

In an example embodiment of the present inventive concept, an upper surface of the first dummy structure 124 may have a circular shape having a diameter of the second width W2 greater than the first width W1 of the channel structure 122. The first dummy structure 124 and the channel structure 122 may be spaced apart from each other in the first direction by the first distance d1. As the upper surface of the first dummy structure 124 may have the diameter of the second width W2 greater than the first width W1, the second pitch P2 may be greater than the first pitch P1.

As described above, the first dummy structure 124 and the channel structure 122 adjacent to the first dummy structure 124 may be arranged to have the second pitch P2, so that failures of the first dummy structure 124 may decrease. When the first dummy structure 124 has reduced defects, electrical failures caused by these defects at the actual memory cells via the conductive pattern structure 140 shared by the first dummy structure 124 may also be reduced.

Figure 6:
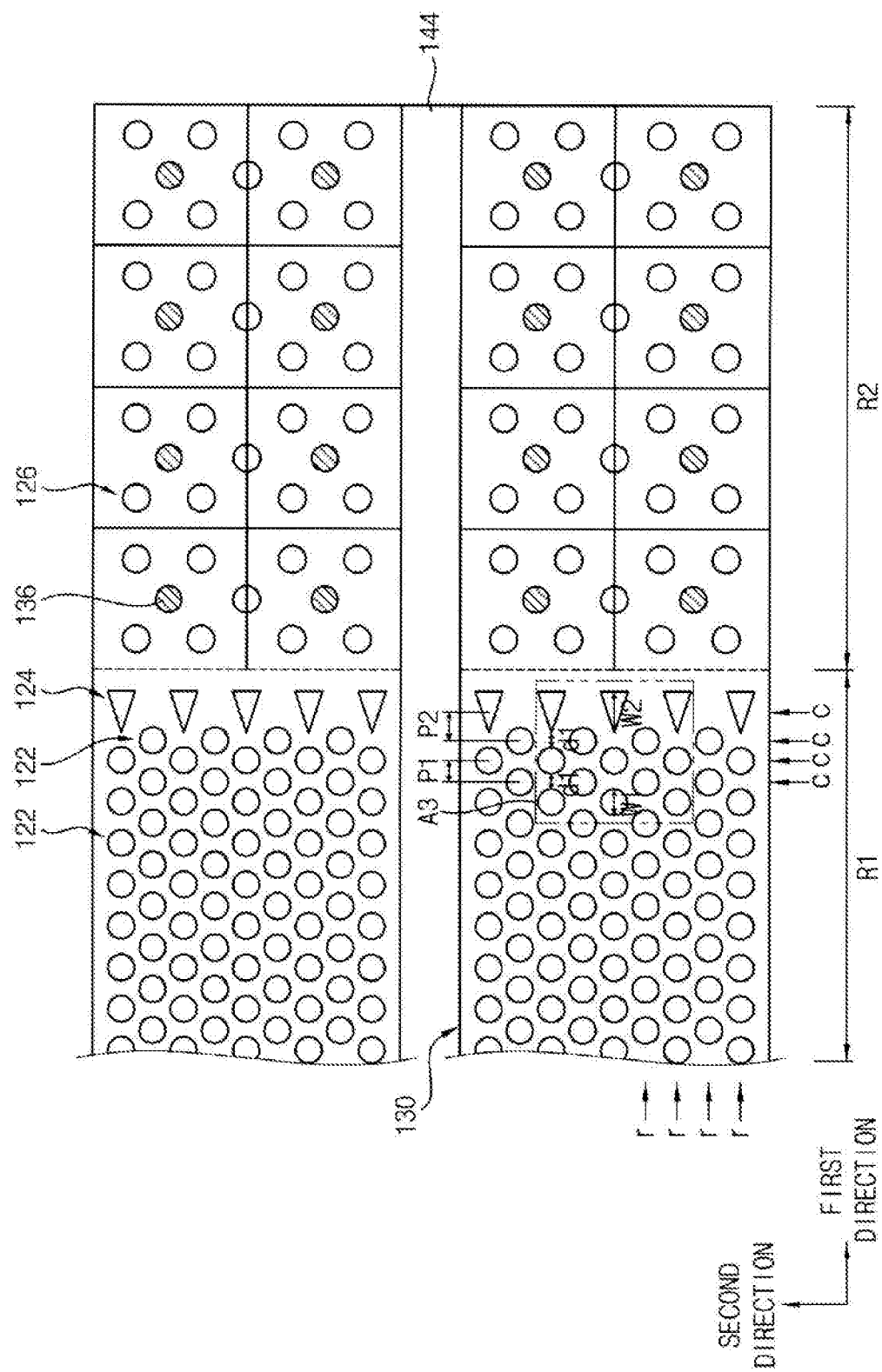
FIG. 6 is a plan view illustrating a vertical semiconductor device in accordance with an example embodiment of the present inventive concept.
Figure 7:
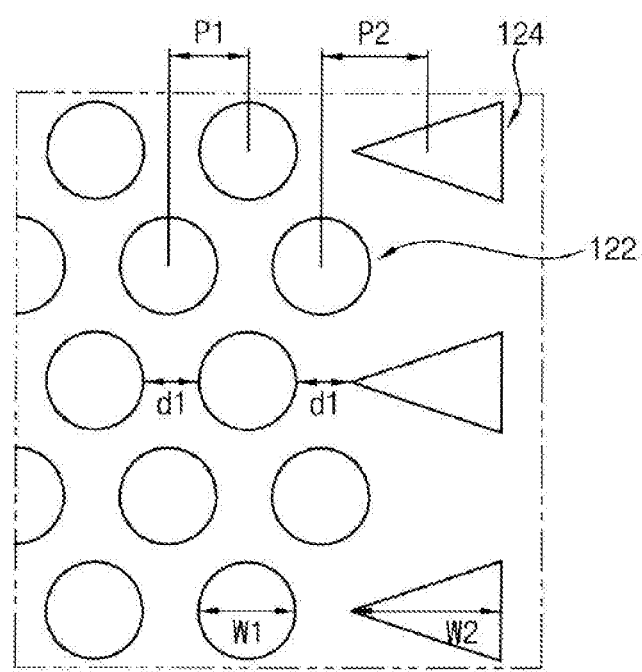
FIG. 7 is an enlarged plan view of a portion 'A3' in FIG. 6.

FIG. 6 is a plan view illustrating a vertical semiconductor device in accordance with an example embodiment of the present inventive concept. FIG. 7 is an enlarged plan view of a portion 'A3' in FIG. 6.

The vertical semiconductor device illustrated in FIGS. 6 and 7 may be substantially the same as the vertical semiconductor device illustrated with reference to FIGS. 1 to 3, except for the shape of the first dummy structure.

Referring to FIGS. 6 and 7, the first dummy structure 124 and the channel structure 122 adjacent to the first dummy structure 124 may be disposed to have the second pitch P2 different from the first pitch P1. The first dummy structure 124 and the channel structure 122 adjacent to the first dummy structure 124 may have shapes different from each other.

In an example embodiment of the present inventive concept, an upper surface of the first dummy structure 124 may have an isosceles triangular shape. A lower base of the isosceles triangle may be adjacent to the boundary of the second region R2. The upper surface of the first dummy structure 124 may have the second width W2 in the first direction greater than the first width W1. For example, a height of the isosceles triangle may have the second width W2.

The first dummy structure 124 and the channel structure 122 may be spaced apart from each other in the first direction by the first distance d1. As the upper surface of the first dummy structure 124 may have the second width W2 greater than the first width W1, the second pitch P2 may be greater than the first pitch P1. Thus, failures of the first dummy structure 124 may decrease. When the first dummy structure 124 has reduced defects, electrical failures caused by these defects at the actual memory cells via the conductive pattern structure 140 shared by the first dummy structure 124 may also be reduced.

Figure 8:
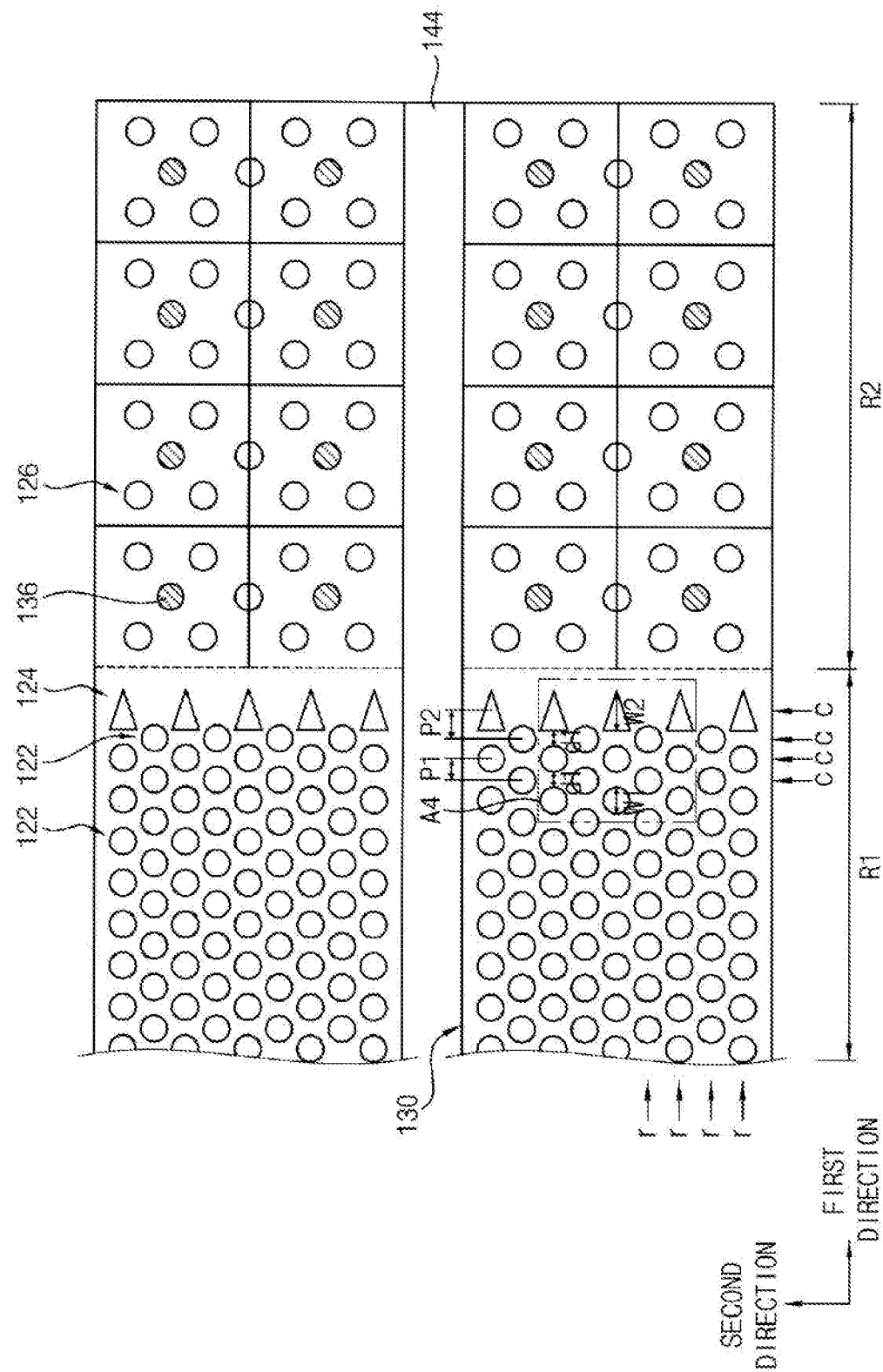
FIG. 8 is a plan view illustrating a vertical semiconductor device in accordance with an example embodiment of the present inventive concept.
Figure 9:
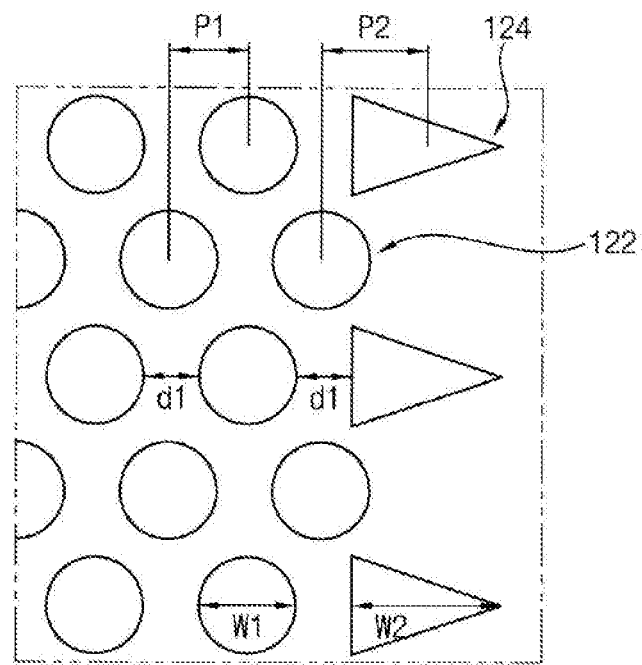
FIG. 9 is an enlarged plan view of a portion 'A4' in FIG. 8.

FIG. 8 is a plan view illustrating a vertical semiconductor device in accordance with an example embodiment of the present inventive concept. FIG. 9 is an enlarged plan view of a portion 'A4' in FIG. 8.

The vertical semiconductor device illustrated in FIGS. 8 and 9 may be substantially the same as the vertical semiconductor device illustrated with reference to FIGS. 1 to 3, except for the shape of the first dummy structure.

Referring to FIGS. 8 and 9, the first dummy structure 124 and the channel structure 122 adjacent to the first dummy structure 124 may be disposed to have the second pitch P2 different from the first pitch P1. The first dummy structure 124 and the channel structure 122 adjacent to the first dummy structure 124 may have shapes different from each other.

In an example embodiment of the present inventive concept, an upper surface of the first dummy structure 124 may have an isosceles triangular shape. A lower base of the isosceles triangle may be oriented towards a central portion of the first region R1. The upper surface of the first dummy structure 124 may have the second width W2 in the first direction greater than the first width W1. For example, a height of the isosceles triangle may have the second width W2.

The first dummy structure 124 and the channel structure 122 may be spaced apart from each other in the first direction by the first distance d1. As the upper surface of the first dummy structure 124 may have the second width W2 greater than the first width W1, the second pitch P2 may be greater than the first pitch P1. Thus, failures of the first dummy structure 124 may decrease. When the first dummy structure 124 has reduced defects, electrical failures caused by these defects at the actual memory cells via the conductive pattern structure 140 shared by the first dummy structure 124 may also be reduced.

Figure 10:
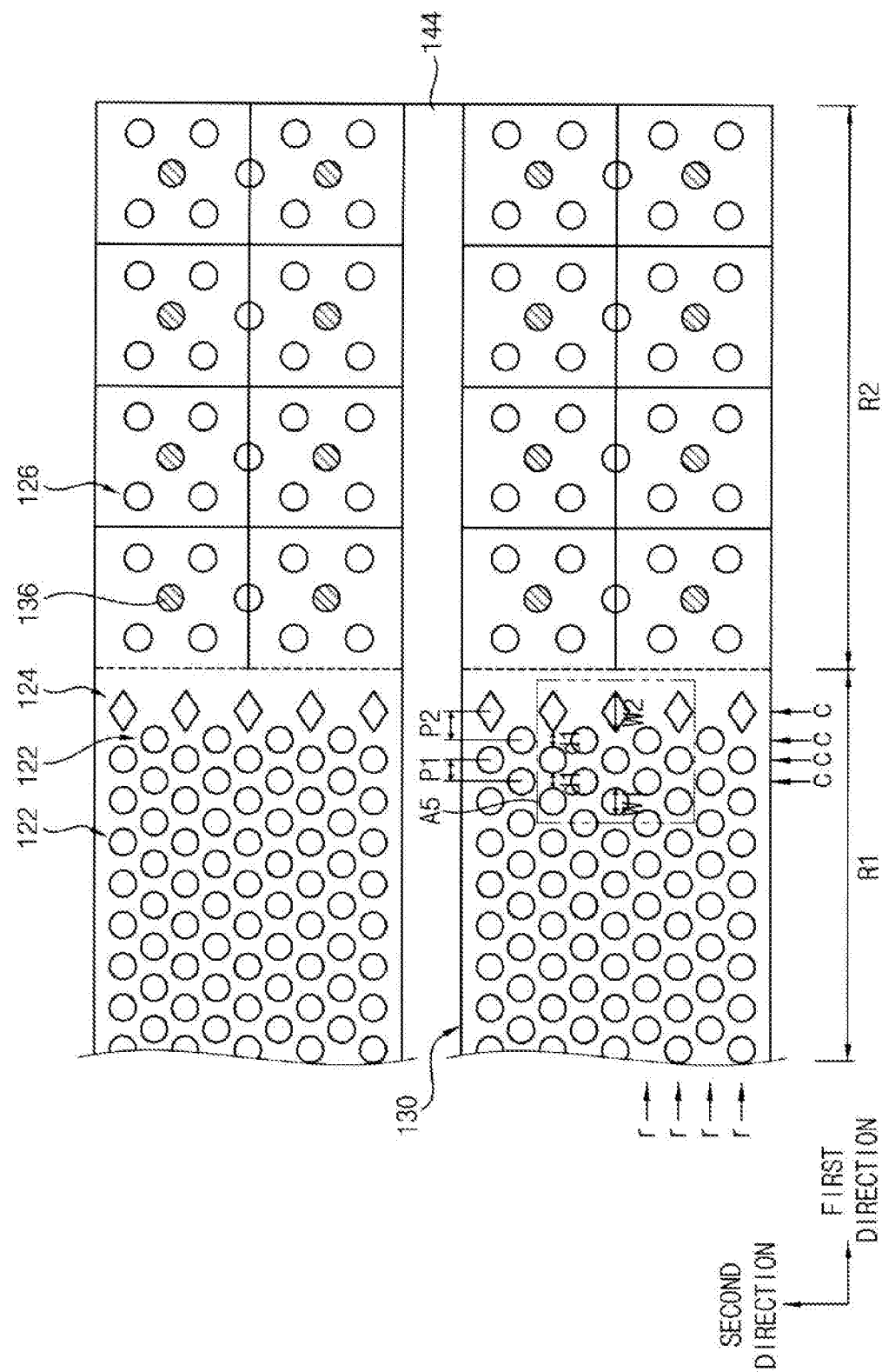
FIG. 10 is a plan view illustrating a vertical semiconductor device in accordance with an example embodiment of the present inventive concept.
Figure 11:
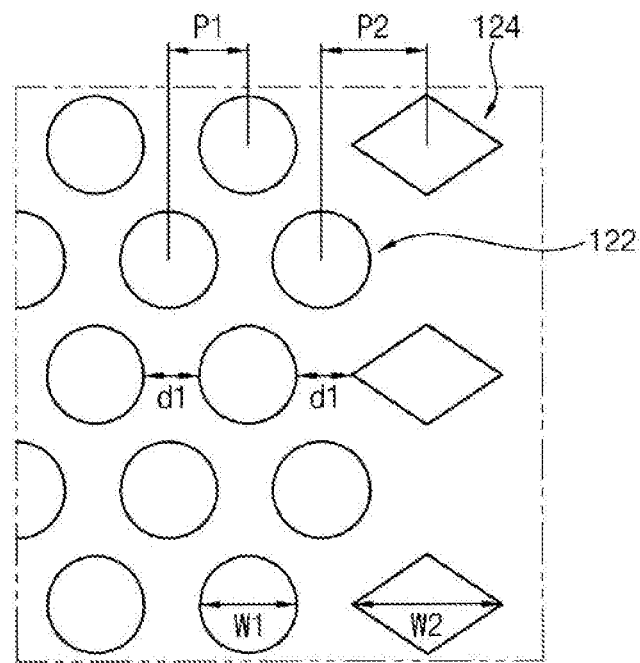
FIG. 11 is an enlarged plan view of a portion 'A5' in FIG. 10.

FIG. 10 is a plan view illustrating a vertical semiconductor device in accordance with an example embodiment of the present inventive concept. FIG. 11 is an enlarged plan view of a portion 'A5' in FIG. 10.

The vertical semiconductor device illustrated in FIGS. 10 and 11 may be substantially the same as the vertical semiconductor device illustrated with reference to FIGS. 1 to 3, except for the shape of the first dummy structure.

Referring to FIGS. 10 and 11, the first dummy structure 124 and the channel structure 122 adjacent to the first dummy structure 124 may be disposed to have the second pitch P2 different from the first pitch P1. The first dummy structure 124 and the channel structure 122 adjacent to the first dummy structure 124 may have shapes different from each other.

In an example embodiment of the present inventive concept, an upper surface of the first dummy structure 124 may have a rhombus shape. A long diagonal line of the rhombus may be disposed in the first direction. The long diagonal line of the rhombus may have a second width W2 in the first direction greater than the first width W1.

The first dummy structure 124 and the channel structure 122 may be spaced apart from each other in the first direction by the first distance d1. As the upper surface of the first dummy structure 124 may have the second width W2 greater than the first width W1, the second pitch P2 may be greater than the first pitch P1. Thus, failures of the first dummy structure 124 may decrease. When the first dummy structure 124 has reduced defects, electrical failures caused by these defects at the actual memory cells via the conductive pattern structure 140 shared by the first dummy structure 124 may also be reduced.

Figure 12:
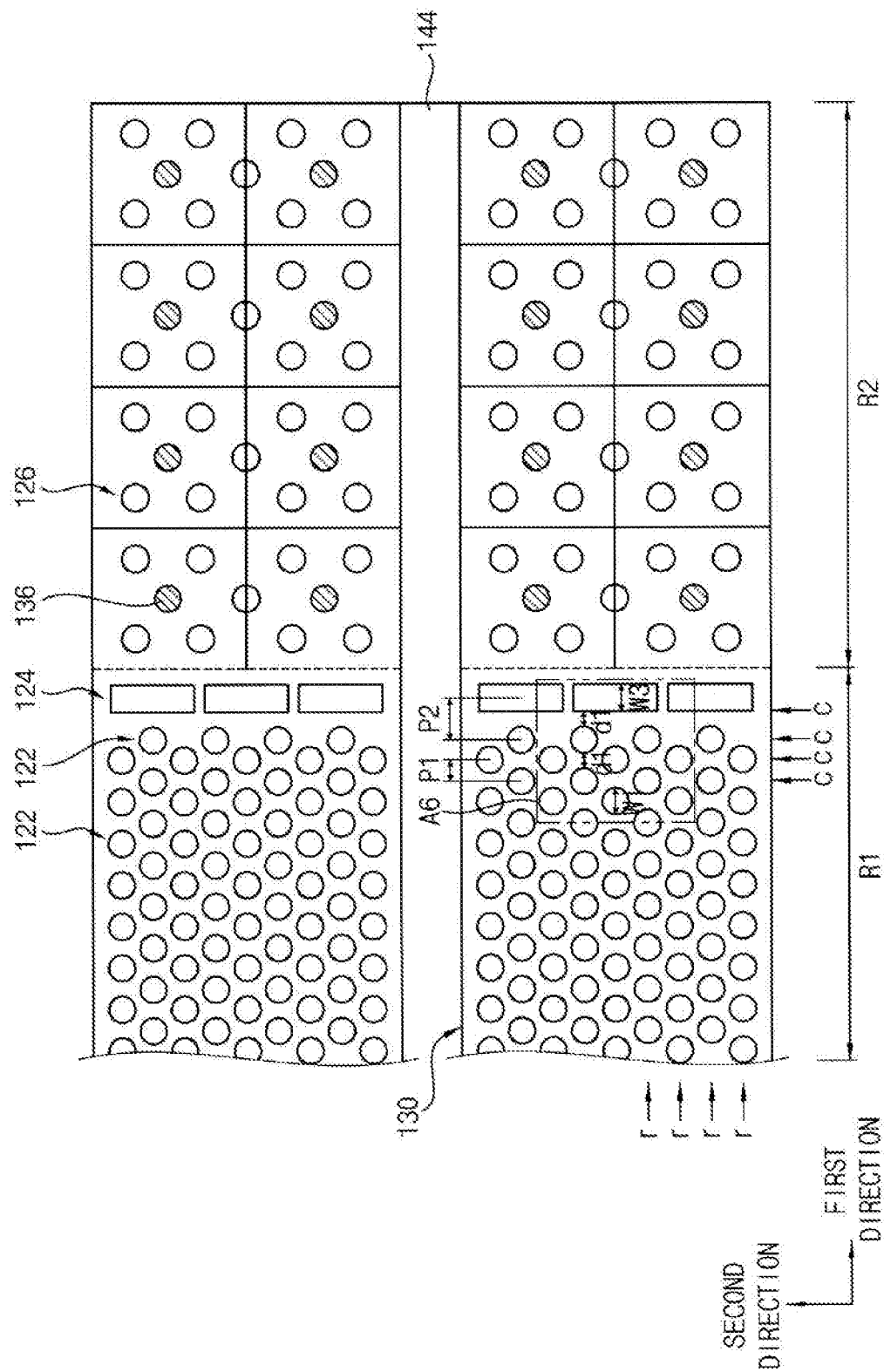
FIG. 12 is a plan view illustrating a vertical semiconductor device in accordance with an example embodiment of the present inventive concept.
Figure 13:
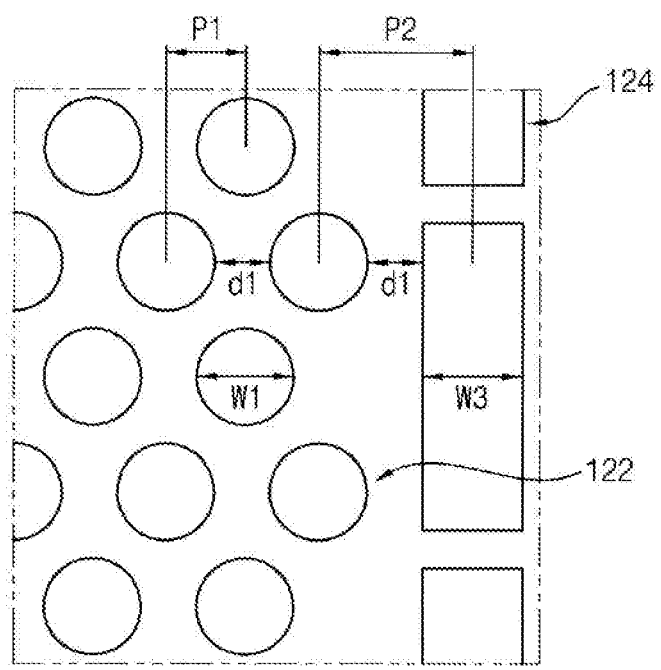
FIG. 13 is an enlarged plan view of a portion 'A6' in FIG. 12.

FIG. 12 is a plan view illustrating a vertical semiconductor device in accordance with an example embodiment of the present inventive concept. FIG. 13 is an enlarged plan view of a portion 'A6' in FIG. 12.

The vertical semiconductor device illustrated in FIGS. 12 and 13 may be substantially the same as the vertical semiconductor device illustrated with reference to FIGS. 1 to 3, except for the shape of the first dummy structure.

Referring to FIGS. 12 and 13, the first dummy structure 124 and the channel structure 122 adjacent to the first dummy structure 124 may be disposed to have the second pitch P2 different from the first pitch P1. The first dummy structure 124 and the channel structure 122 adjacent to the first dummy structure 124 may have shapes different from each other.

In an example embodiment of the present inventive concept, an upper surface of the first dummy structure 124 may have a linear shape extending in the second direction. The linear shape may be, for example, a rectangular shape. A plurality of first dummy structures 124 having the linear shape may be aligned with each other in the second direction. At least two channel structures 122 may be disposed to be adjacent to one of the first dummy structures 124. The first dummy structure 124 may have a third width W3 in the first direction substantially the same as or greater than the first width W1.

The first dummy structure 124 and the channel structure 122 may be spaced apart from each other in the first direction by the first distance d1. The second pitch P2 may be greater than the first pitch P1.

A volume of a first dummy hole for forming the first dummy structure 124 may be greater than a volume of a channel hole for forming the channel structure 122. Thus, when the first dummy hole is formed, a not-open failure of the first dummy hole may decrease. Also, failures of the first dummy structure 124 may decrease. When the first dummy structure 124 has reduced defects, electrical failures caused by these defects at the actual memory cells via the conductive pattern structure 140 shared by the first dummy structure 124 may also be reduced.

Figure 14:
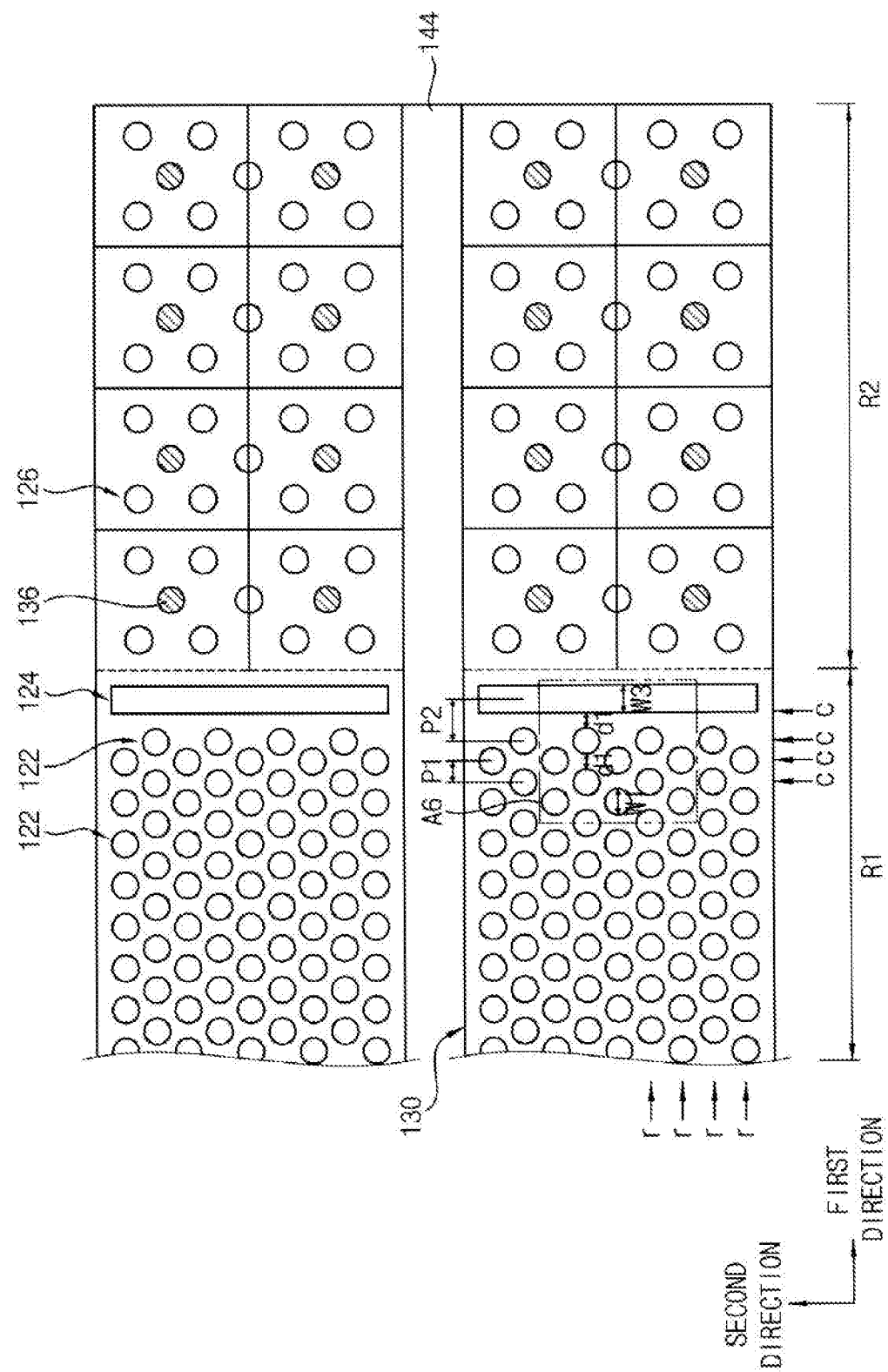
FIG. 14 is a plan view illustrating a vertical semiconductor device in accordance with an example embodiment of the present inventive concept.

FIG. 14 is a plan view illustrating a vertical semiconductor device in accordance with an example embodiment of the present inventive concept.

The vertical semiconductor device illustrated in FIG. 14 may be substantially the same as the vertical semiconductor device illustrated with reference to FIGS. 1 to 3, except for the shape of the first dummy structure.

Referring to FIG. 14, the first dummy structure 124 and the channel structure 122 adjacent to the first dummy structure 124 may be disposed to have the second pitch P2 different from the first pitch P1. The first dummy structure 124 and the channel structure 122 adjacent to the first dummy structure 124 may have shapes different from each other.

In an example embodiment of the present inventive concept, an upper surface of the first dummy structure 124 may have a linear shape extending in the second direction. One first dummy structure 124 having the linear shape may be formed in each of the conductive pattern structures 140. The first dummy structure 124 may have the third width W3 in the first direction substantially the same as or greater than the first width W1.

The first dummy structure 124 and the channel structure 122 may be spaced apart from each other in the first direction by the first distance d1. The second pitch P2 may be greater than the first pitch P1.

A volume of a first dummy hole for forming the first dummy structure 124 may be greater than a volume of a channel hole for forming the channel structure 122. Thus, when the first dummy hole is formed, a not-open failure of the first dummy hole may decrease. Also, failures of the first dummy structure 124 may decrease. When the first dummy structure 124 has reduced defects, electrical failures caused by these defects at the actual memory cells via the conductive pattern structure 140 shared by the first dummy structure 124 may also be reduced.

FIGS. 15 to 25 are cross-sectional views and plan views illustrating stages of a method of manufacturing a vertical semiconductor device in accordance with an example embodiment of the present inventive concept.

FIGS. 15, 16, 18, 19, 21, 23 and 25 are cross-sectional views, and FIGS. 17, 20, 22 and 24 are plan views. Hereinafter, a method of manufacturing the vertical semiconductor device shown in FIGS. 1, 2 and 3 may be mainly described.

Figure 15:
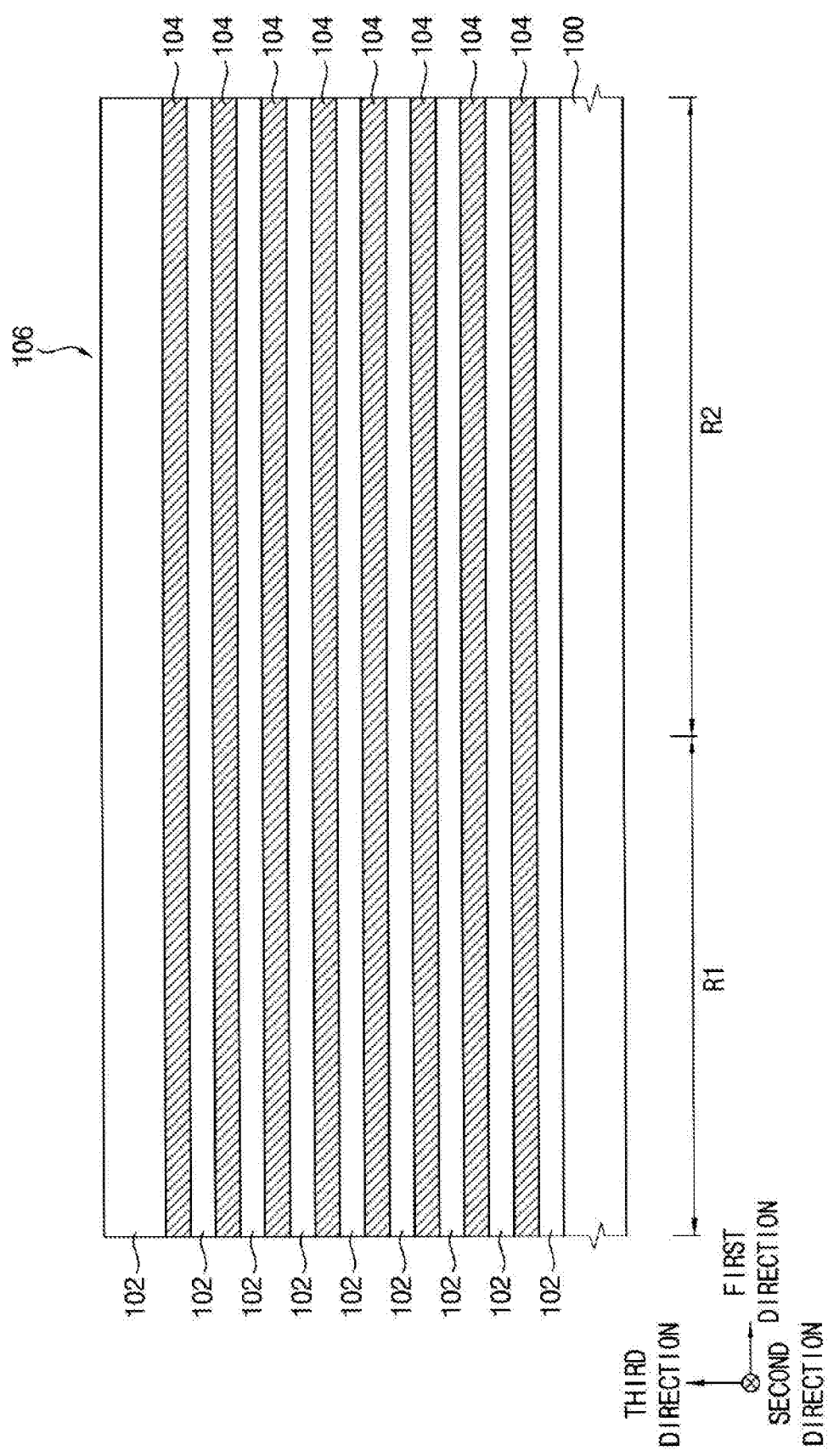
FIGS. 15 to 25 are cross-sectional views and plan views illustrating stages of a method of manufacturing a vertical semiconductor device in accordance with an example embodiment of the present inventive concept.

Referring to FIG. 15, insulation layers 102 and sacrificial layers 104 may be alternately and repeatedly stacked on the substrate 100 to form a preliminary mold structure 106 in first and second regions R1 and R2 of a substrate 100.

In an example embodiment of the present inventive concept, a lowermost insulation layer 102 may serve as a pad insulation layer. An uppermost insulation layer 102 may have a thickness greater than those of other ones of the insulation layers 102 in the preliminary mold structure 106.

In an example embodiment of the present inventive concept, the insulation layers 102 may be formed of an oxide-based material, and may include at least one of, e.g., silicon oxide ($SiO_2$), silicon oxycarbide (SiCO), hydrogenated silicon oxycarbide (SiCOH) silicon oxyflouride (SiOF), etc. In an example embodiment of the present inventive concept, the sacrificial layers 104 may be formed of a nitride-based material, e.g., silicon nitride ($Si_3N_4$) and/or silicon boronitride (SiBN).

Figure 16:
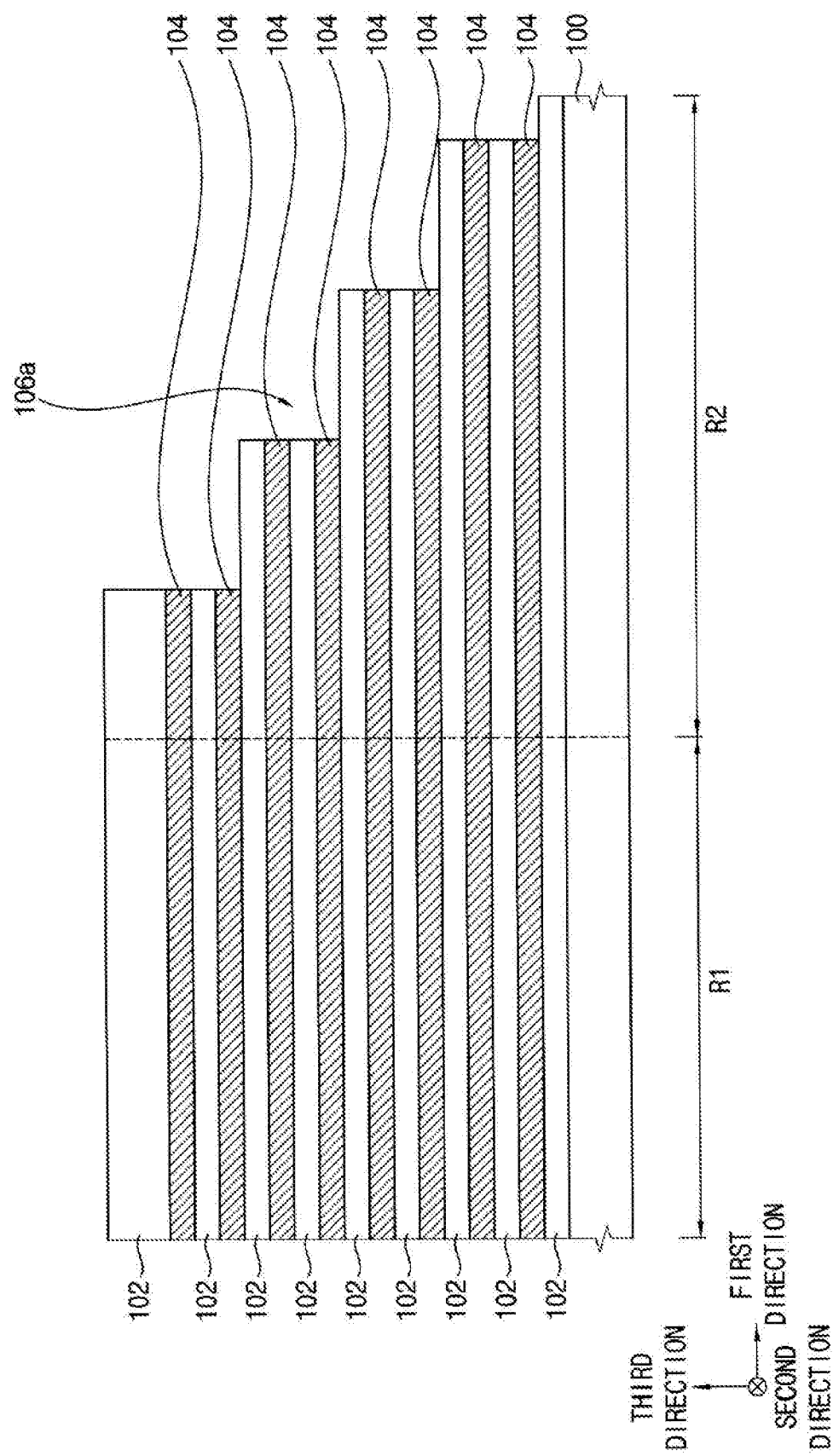
Figure 17:
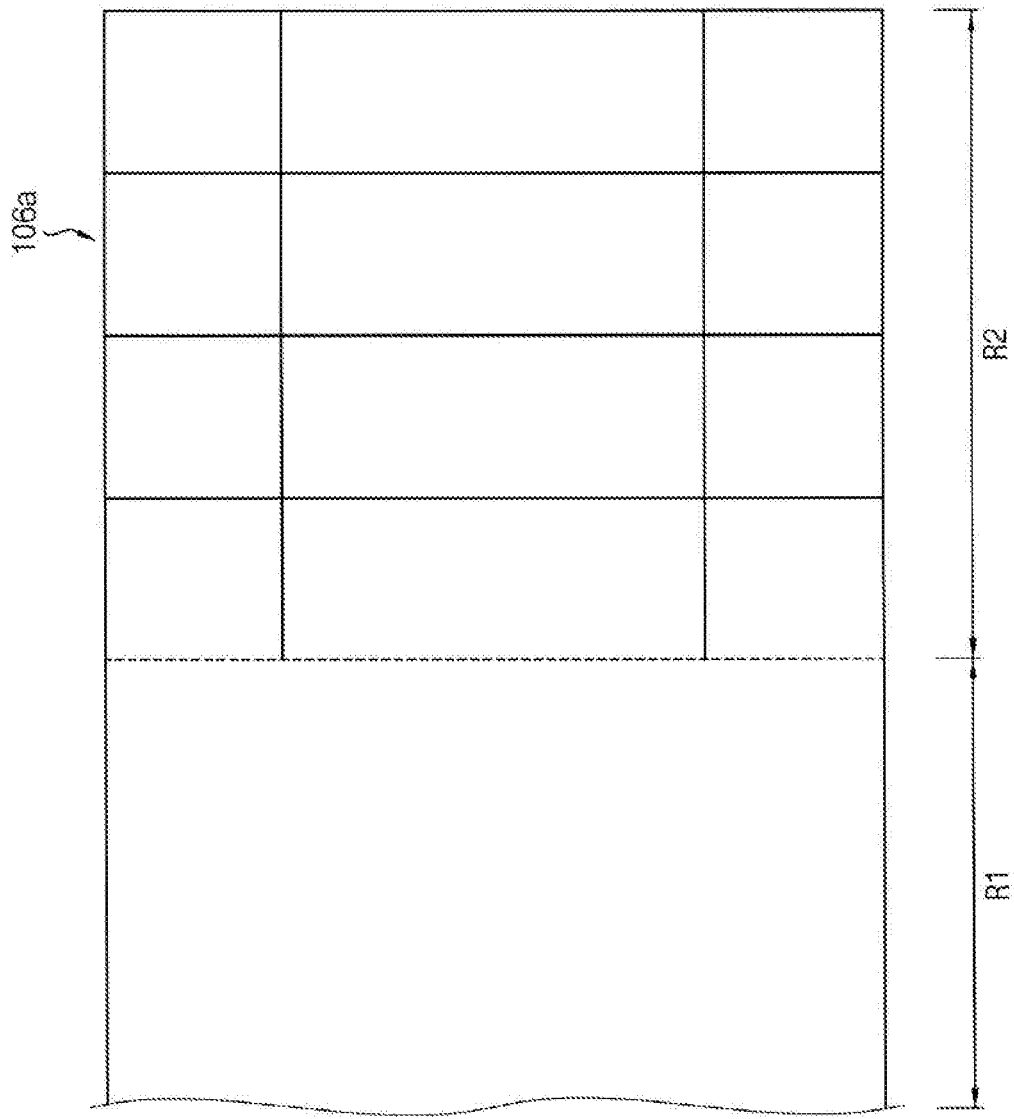

Referring to FIGS. 16 and 17, edge portions of the preliminary mold structure 106 in the second region R2 may be sequentially etched to form a preliminary step mold structure 106a. In an example embodiment of the present inventive concept, the preliminary step mold structure 106a in the second region R2 may have a staircase shape in each of the first and second directions. The number of steps formed in the first and second directions may not be limited.

The sacrificial layers 104 of the preliminary step mold structure 106a in the first region R1 may be replaced with conductive patterns of memory cells by subsequent processes.

In the preliminary step mold structure 106a in the second region R2, each step at each level may serve as a pad region electrically connected to the conductive patterns of the memory cells by subsequent processes.

Figure 18:
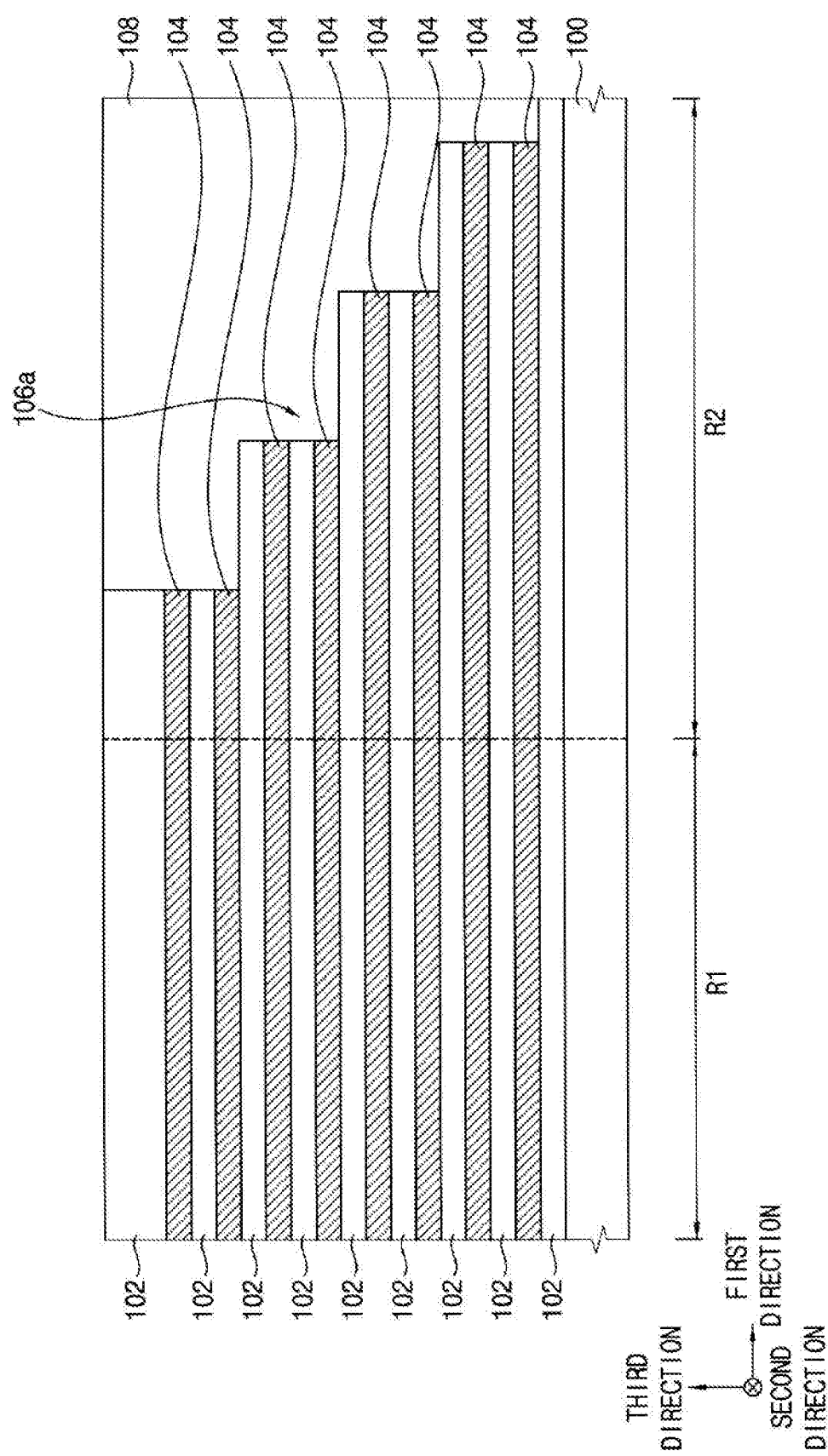

Referring to FIG. 18, a first upper insulating interlayer 108 may be formed on the preliminary step mold structure 106a. An upper surface of the first upper insulating interlayer 108 may be substantially flat.

In an example embodiment of the present inventive concept, the first upper insulating interlayer 108 may be formed by depositing an oxide layer including at least one of, e.g., silicon oxide ($SiO_2$), silicon oxycarbide (SiCO), hydrogenated silicon oxycarbide (SiCOH), and silicon oxyflouride (SiOF), and planarizing an upper surface of the oxide layer. The planarization process may include a chemical mechanical polishing (CMP) process and/or an etch back process.

Figure 19:
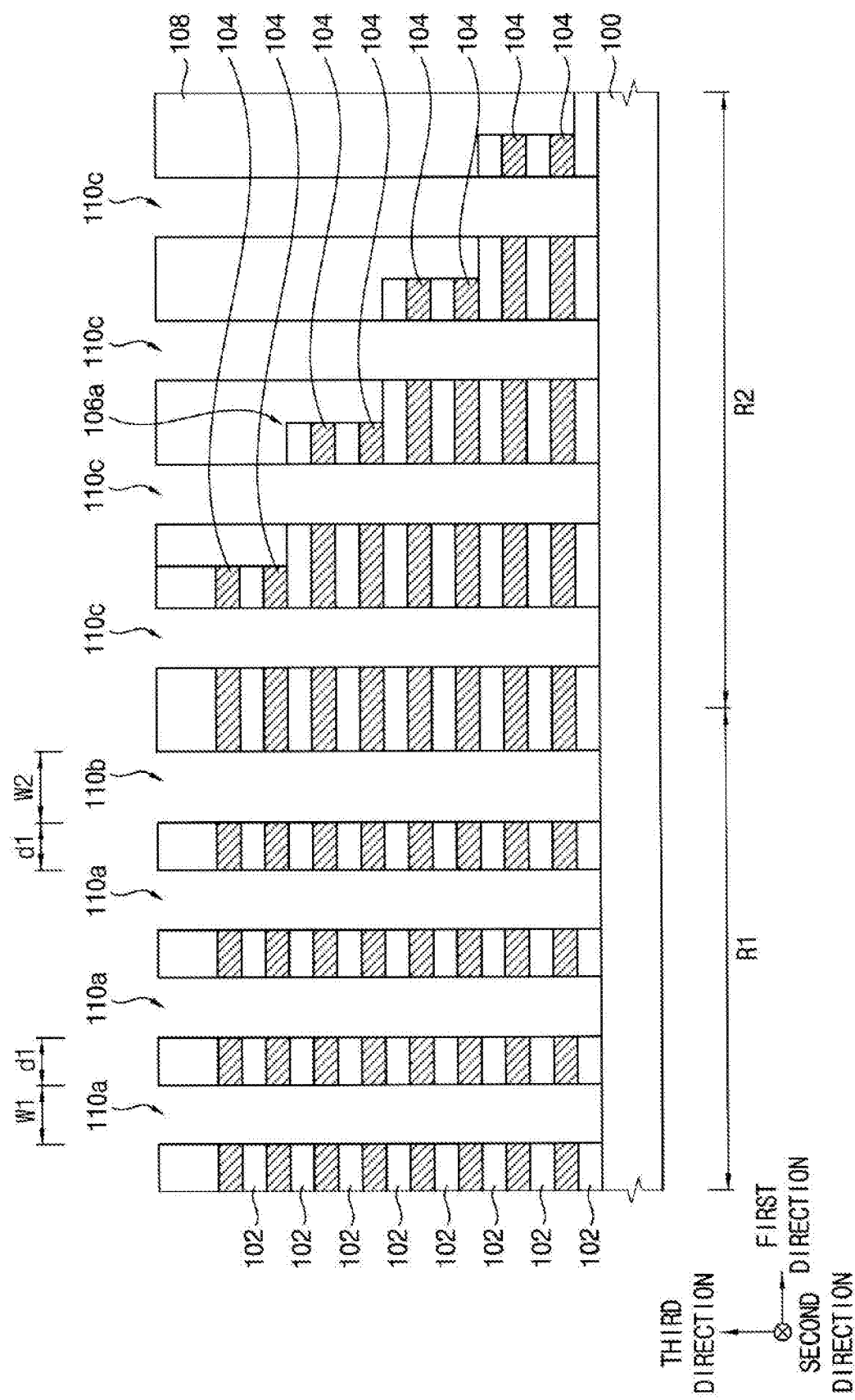
Figure 20:
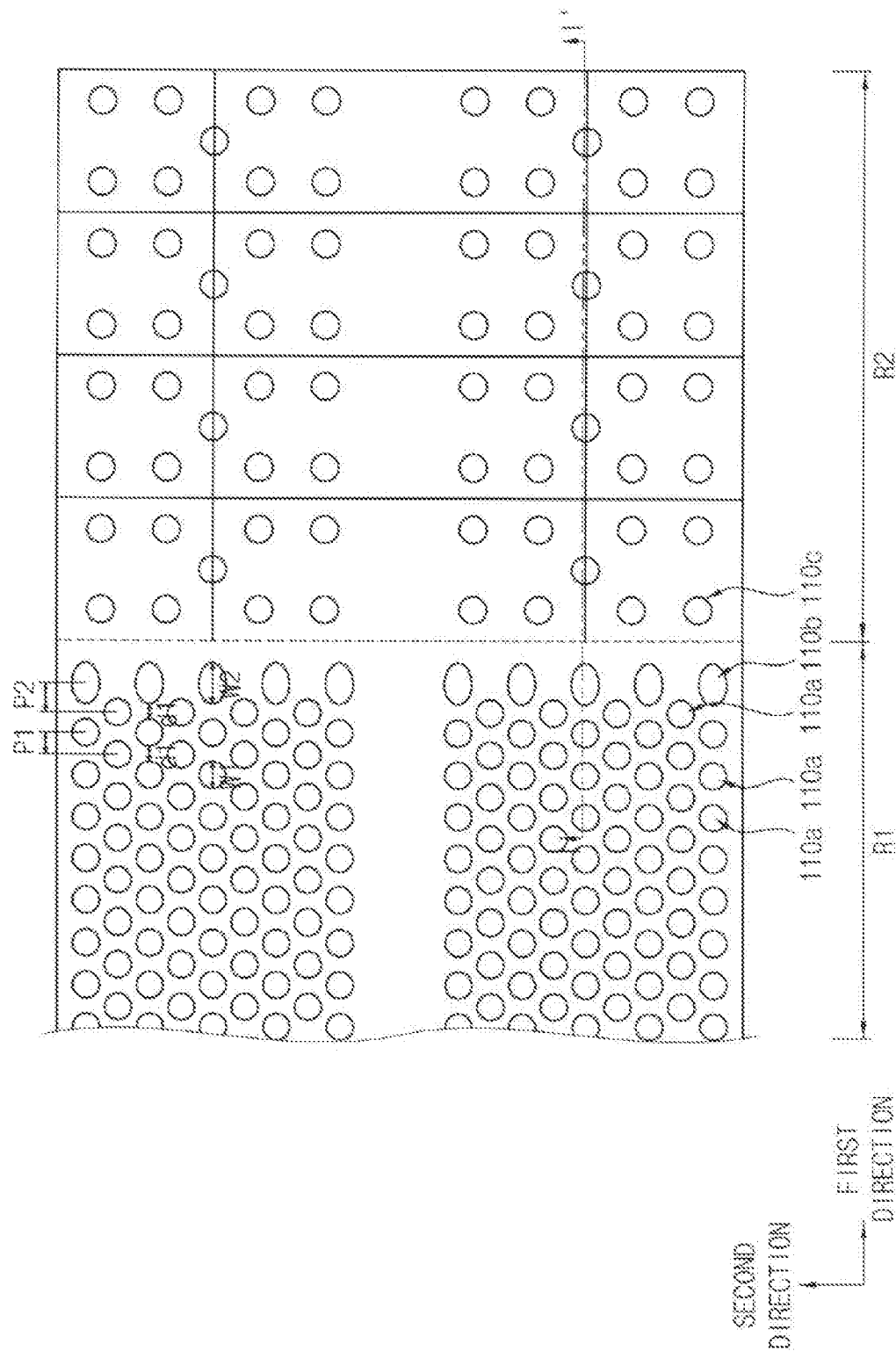

Referring to FIGS. 19 and 20, the preliminary step mold structure 106a and the first upper insulating interlayer 108 may be anisotropically etched to form a plurality of holes 110a, 110b and 110c exposing upper surfaces of the substrate 100. The holes 110a, 110b and 110c may be formed through the preliminary step mold structure 106a and the first upper insulating interlayer 108. For example, a plurality of channel holes 110a and a plurality of first dummy holes 110b may be formed through the preliminary step mold structure 106a in the first region R1. A plurality of second dummy holes 110c may be formed through the preliminary step mold structure 106a and the first upper insulating interlayer 108 in the second region R2. The first dummy holes 110b may be disposed at an edge portion of the first region R1 in the first direction that is adjacent to the second region R2. For example, the first dummy holes 110b may be disposed in the first region R1 between a boundary of the second region R2 and a column of the channel holes 110a closest to the boundary of the second region R2.

A channel structure may be subsequently formed in the channel hole 110a. A first dummy structure may be subsequently formed in the first dummy hole 110b. A second dummy structure may be subsequently formed in the second dummy hole 110c. Thus, the channel structure, the first dummy structure and the second dummy structure may have arrangements and shapes according to arrangements and shapes of the channel hole 110a, the first dummy hole 110b and the second dummy hole 110c, respectively.

In an example embodiment of the present inventive concept, the channel holes 110a may be disposed to have a first pitch P1. An upper surface of each of the channel holes 110a may have a circular shape to have a first width W1. The channel holes 110a may be spaced apart from each other in the first direction by a first distance d1.

The first dummy hole 110b and the channel hole 110a adjacent to the first dummy hole 110b may be disposed to have a second pitch P2 different from the first pitch P1. In an example embodiment of the present inventive concept, the second pitch P2 may be greater than the first pitch P1. Thus, the arrangements and the shapes of the first dummy holes 110b may be different from the arrangements and the shapes of the channel holes 110a.

The second dummy holes 110c may be spaced apart from each other in the first direction by a distance greater than the first distance d1. The second dummy holes 110c may be disposed to have a pitch greater than the second pitch P2.

In a plan view, the shape of the first dummy hole 110b may be different from the shape of the channel hole 110a.

The first and second dummy holes 110b and 110c and the channel holes 110a may be formed by a photolithography process. In the photolithography process, a reticle for forming the first dummy hole 110b, a reticle for forming the channel hole 110a and a reticle for forming the second dummy hole 110c may be different from each other. In the photolithography process, the first and second dummy holes 110b and 110c and the channel holes 110a may be formed simultaneously or separately.

In an example embodiment of the present inventive concept, when the vertical semiconductor device shown in FIGS. 1 to 3 is manufactured, a reticle for forming the first dummy hole 110b may have a long rectangular shape in the first direction. Thus, the upper surface of the first dummy hole 110b may have an elliptical shape of which a major axis may be in the first direction. In an example embodiment of the present inventive concept, the upper surface of the first dummy hole 110b may have a second width W2 in the first direction greater than the first width W1, and have the first width W1 in the second direction. For example, the upper surface of the first dummy hole 110b may have an elliptical shape of which the major axis may have the second width W2 in the first direction, and the minor axis may have the first width W1 in the second direction.

In an example embodiment of the present inventive concept, when the vertical semiconductor device shown in FIGS. 4 and 5 is manufactured, a reticle for forming the first dummy hole 110b may have a square shape having a second width W2 greater than the first width W1. Thus, the upper surface of the first dummy hole 110b may have a circular shape having a diameter substantially the same as the second width W2.

In an example embodiment of the present inventive concept, when the vertical semiconductor device shown in FIGS. 6 and 7 is manufactured, an upper surface of the first dummy hole 110b may have an isosceles triangular shape. A lower base of the isosceles triangle may be adjacent to the boundary of the second region R2.

In an example embodiment of the present inventive concept, when the vertical semiconductor device shown in FIGS. 8 and 9 is manufactured, an upper surface of the first dummy hole 110b may have an isosceles triangular shape. A lower base of the isosceles triangle may be oriented towards a central portion of the first region R1.

In an example embodiment of the present inventive concept, when the vertical semiconductor device shown in FIGS. 10 and 11 is manufactured, an upper surface of the first dummy hole 110b may have a rhombus shape.

In an example embodiment of the present inventive concept, when the vertical semiconductor device shown in FIGS. 12 and 13 is manufactured, an upper surface of the first dummy hole 110b may have a linear shape extending in the second direction. A plurality of the first dummy holes 110b having the linear shape may be aligned in the second direction, and may be spaced apart from each other.

In an example embodiment of the present inventive concept, when the vertical semiconductor device shown in FIG. 14 is manufactured, an upper surface of the first dummy hole 110b may have a linear shape extending in the second direction.

As described above, one of the vertical semiconductor devices shown in FIGS. 1 to 14 may be manufactured according to the arrangements and the shapes of the first dummy holes 110b. In an example embodiment of the present inventive concept, the shapes of the upper surfaces of the first dummy holes 110b may include, but are not limited to: a circular shape, an elliptical shape, a triangular shape, a rhombus shape, a square shape, a rectangular shape, a linear shape and a polygonal shape. The polygonal shape may include a shape formed with straight lines, and may include, for example, triangles, quadrilaterals, pentagons, hexagons, etc. In addition, the polygonal shape for the first dummy holes 110b here may also include the shape of the first dummy holes 110b formed with a reticle having a polygonal shape. In this case, after the photolithography process used in forming the first dummy holes 110b, the straight lines of the polygonal shape in the reticle may be curved, and/or the edges of the polygonal shape in the reticle may be rounded in the final shape of the first dummy holes 110b.

As the first dummy hole 110b and the channel hole 110a adjacent to the first dummy hole 110b may be disposed to have the second pitch P2, a not-open failure of the first dummy hole 110b may decrease. Also, failures of a first dummy structure subsequently formed may decrease. When the subsequently formed first dummy structure has reduced defects, electrical failures caused by these defects at the actual memory cells may also be reduced.

Figure 21:
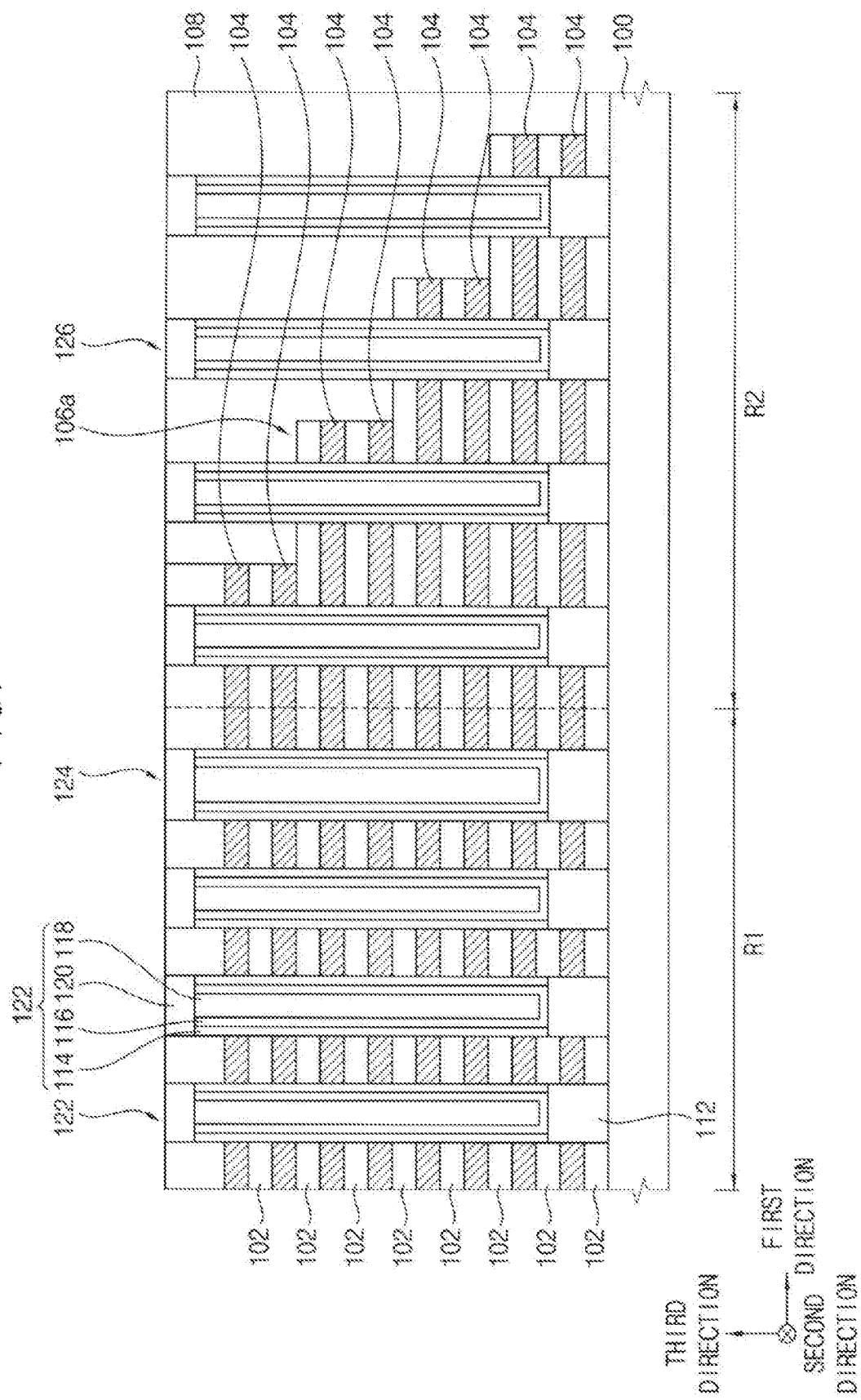

Referring to FIG. 21, a semiconductor pattern 112 may be formed on the upper surface of the substrate 100 exposed by each of the channel hole 110*a*, the first dummy hole 110*b* and the second dummy hole 110*c*. A channel structure 122 may be formed to fill each of the channel holes 110*a*. A first dummy structure 124 may be formed to fill each of the first dummy holes 110*b*. A second dummy structure 126 may be formed to fill each of the second dummy holes 110*c*. Each of the channel structure 122, the first dummy structure 124 and the second dummy structure 126 may be formed on the semiconductor pattern 112.

The semiconductor pattern 112 may be formed by a selective epitaxial growth (SEG) process using the upper surfaces of the substrate 100 exposed by the channel hole 110*a*, the first dummy hole 110*b* and the second dummy hole 110*c* as a seed. The channel structure 122 may be formed on the semiconductor pattern 112 to fill the channel hole 110*a*. The first dummy structure 124 may be formed on the semiconductor pattern 112 to fill the first dummy hole 110*b*. The second dummy structure 126 may be formed on the semiconductor pattern 112 to fill the second dummy hole 110*c*. The channel structure 122, the first and second dummy structures 124 and 126 may have substantially the same stacked structure, and in many instances may be formed simultaneously.

In an example embodiment of the present inventive concept, each of the channel structure 122, the first dummy structure 124 and the second dummy structure 126 may include a dielectric structure 114, a channel 116, a filling insulation pattern 118 and an upper conductive pattern 120. The dielectric structure 114 may include a tunnel insulation layer, a charge storage layer and a blocking dielectric layer. The channel 116 may be formed on the semiconductor pattern 112 and the dielectric structure 114. The filling insulation pattern 118 may be formed on the channel 116 to fill an inner space of the channel 116. The upper conductive pattern 120 may be formed on the dielectric structure 114, the channel 116 and the filling insulation pattern 118. The channel structure 122 and the first and second dummy structures 124 and 126 may have substantially the same stacked structure as described above. However, the present inventive concept is not limited thereto. For example, within the stacked structures of the channel structure 122, the first dummy structure 124 and the second dummy structure 126, any two of them may be substantially the same, or all three are different from each other. For example, the channel structure 122 and the first dummy structure 124 may have substantially the same stacked structure, but the substantially same stacked structure of the channel structure 122 and the first dummy structure 124 may be different from the stacked structure of the second dummy structure 126.

Arrangements and shapes of the channel structures 122 may be the same as the arrangements and the shapes of the channel holes 110*a*. Arrangements and shapes of the first dummy structures 124 may be the same as the arrangements and the shapes of the first dummy holes 110*b*. Arrangements and shapes of the second dummy structures 126 may be the same as the arrangements and the shapes of the second dummy holes 110*c*. For example, the channel structure 122, the first dummy structure 124 and the second dummy structure 126 may have arrangements and shapes of one of the vertical semiconductor devices shown in FIGS. 1 to 14 according to the arrangements and the shapes of the first dummy holes 110*b*. However, the shapes of the upper surface of the first dummy structure 124 may include, but are not limited to: a circular shape, an elliptical shape, a triangular shape, a rhombus shape, a square shape, a rectangular shape, a linear shape and a polygonal shape.

Figure 22:
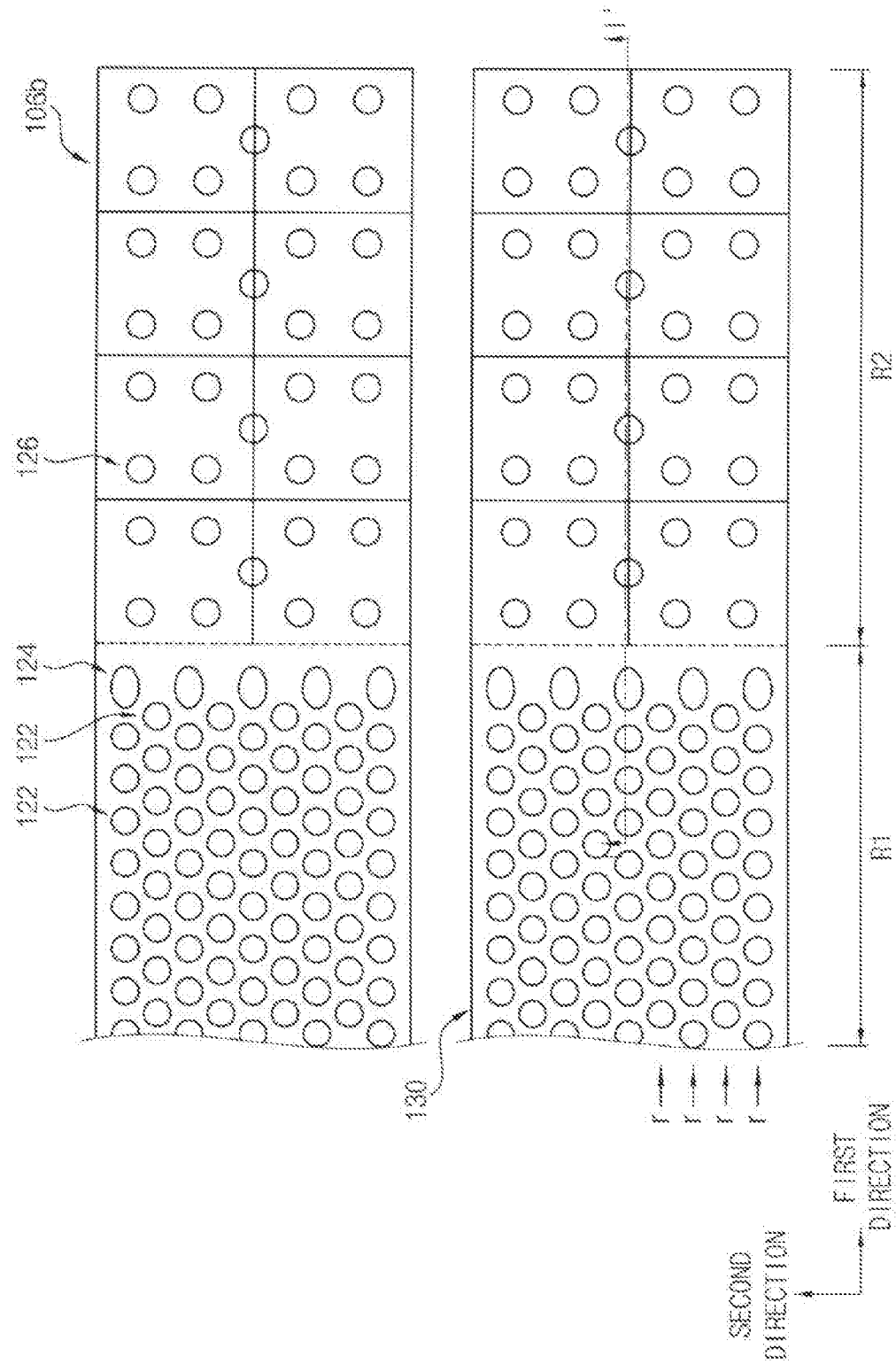
Figure 23:
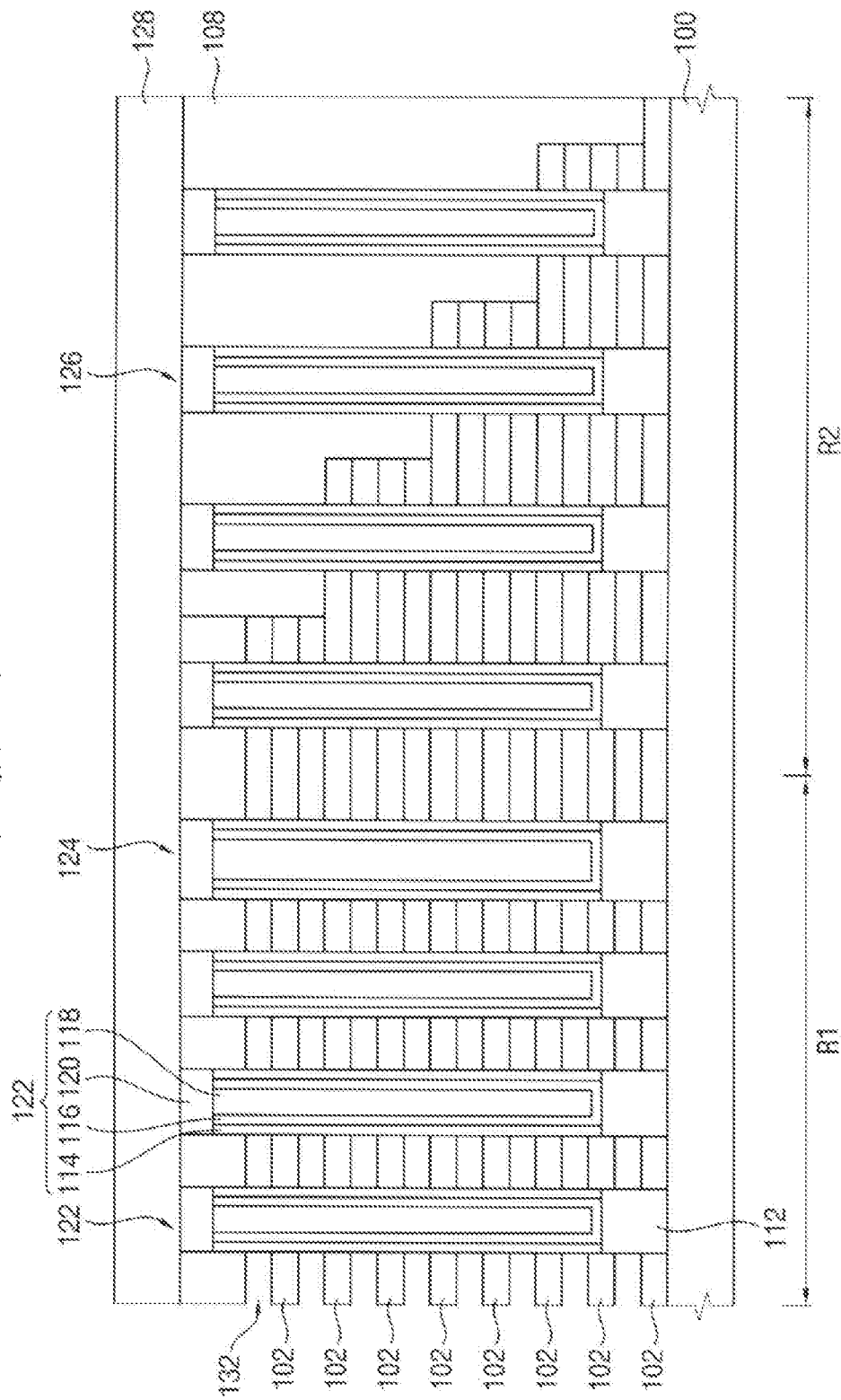

Referring to FIGS. 22 and 23, a second upper insulating interlayer 128 may be formed on the first upper insulating interlayer 108 and the preliminary step mold structure 106*a*. An upper surface of the second upper insulating interlayer 128 may be substantially flat.

The preliminary step mold structure 106*a*, and the first and second upper insulating interlayers 108 and 128 may be anisotropically etched to form an opening 130 extending in the first direction. Thus, the preliminary step mold structure 106*a* may be divided into a plurality of separate pieces to form a step mold structure 106*b* between the openings 130. An upper surface of the substrate 100 may be exposed by the opening 130.

The sacrificial layer 104 exposed by the opening 130 may be removed to form a gap 132 between the insulation layers 102. In an example embodiment of the present inventive concept, the sacrificial layer 104 may be removed by an isotropic etching process.

When the sacrificial layer 104 is removed, the insulation layers 102 may be stably supported by the channel structures 122 and the first and second dummy structures 124 and 126. The gaps 132 may extend horizontally in the first and second directions between the insulation layers 102, and may partially expose sidewalls of the channel structures 122, sidewalls of the first dummy structures 124, and sidewalls of the second dummy structures 126.

Figure 24:
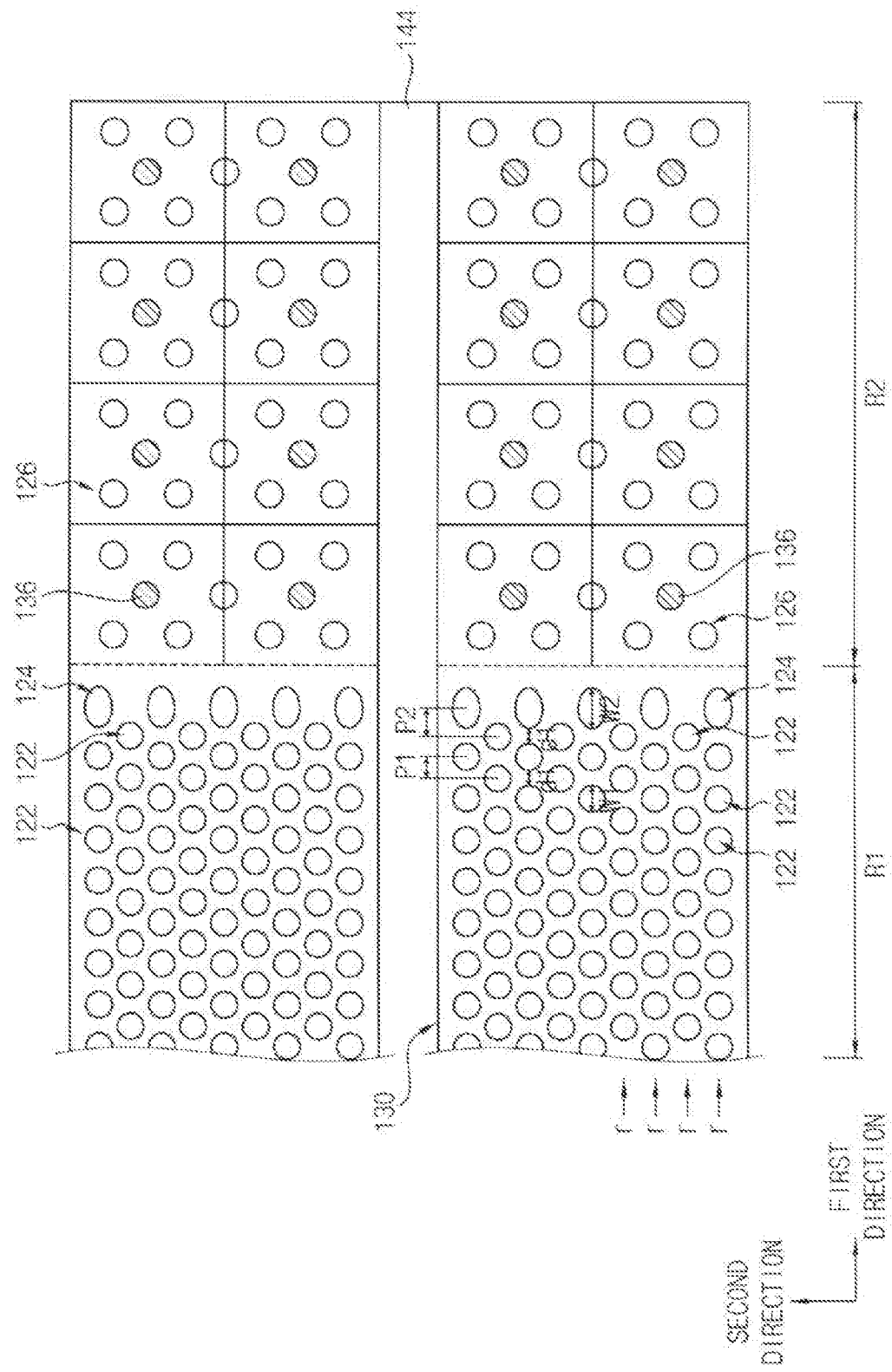
Figure 25:
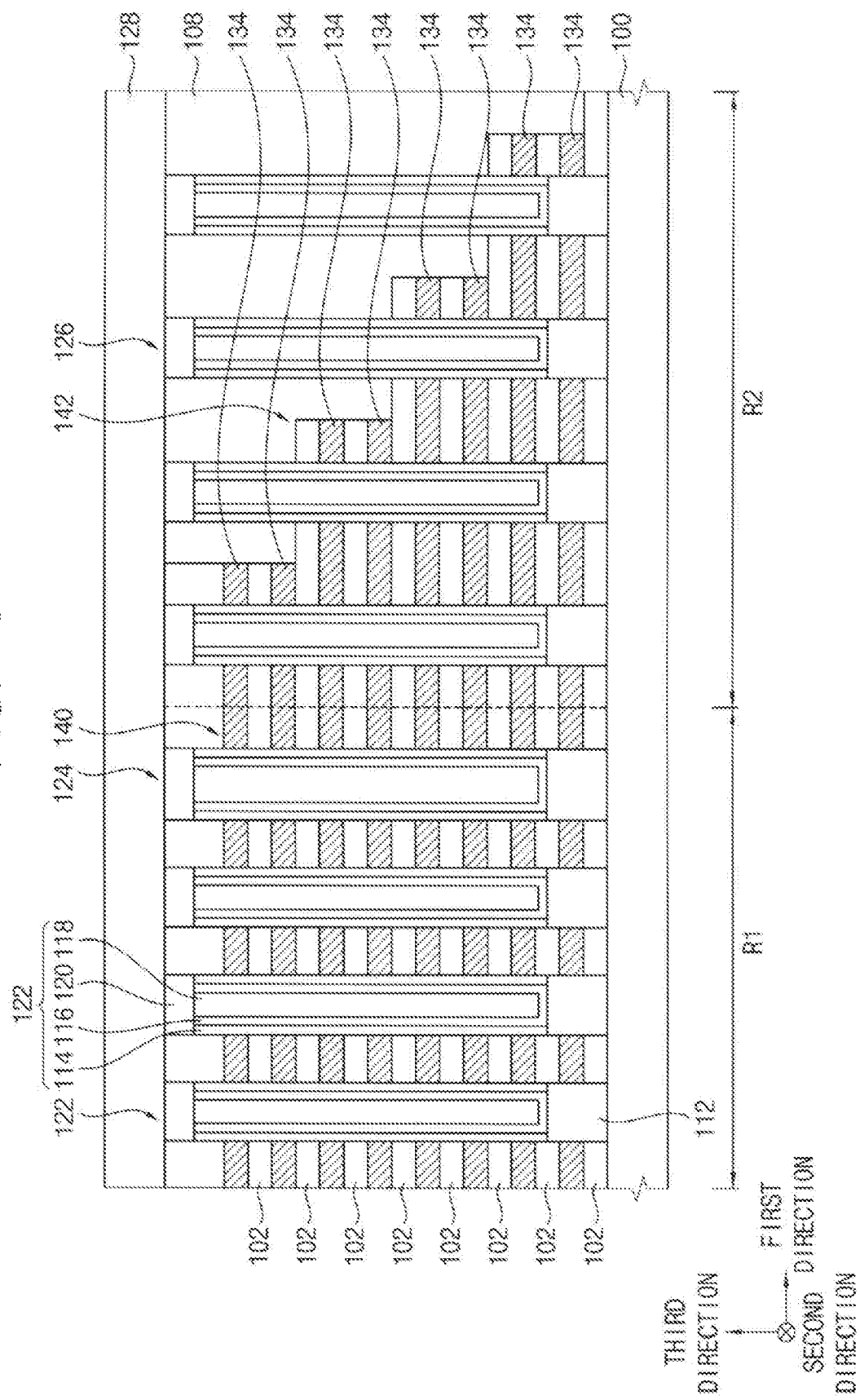

Referring to FIGS. 24 and 25, a conductive layer may be formed to fill the gap 132 so that a conductive pattern 134 may be formed in the first and second regions R1 and R2. Thus, a conductive pattern structure 140 including the conductive patterns 134 and the insulation layers 102 alternately and repeatedly stacked on each other may be formed in the first region R1. A pad structure 142 including the conductive patterns 134 and the insulation layers 102 alternately and repeatedly stacked on each other and having a staircase shape may be formed in the second region R2.

An insulation pattern 144 may be formed to fill the opening 130.

Contact plugs 136 may be formed through the first and second upper insulating interlayers 108 and 128 on the conductive patterns 134 of the pad structure 142, respectively. In an example embodiment of the present inventive concept, at least a contact plug 136 may be formed on each of the conductive patterns 134 in the pad structure 142. The contact plugs 136 may be spaced apart from the second dummy structures 126.

A wiring line electrically connected to the contact plugs 136 may be formed on the second upper insulating interlayer 128. The wiring line may extend in the second direction.

As described above, the vertical semiconductor device in accordance with an example embodiment of the present inventive concept may be manufactured.

Figure 26:
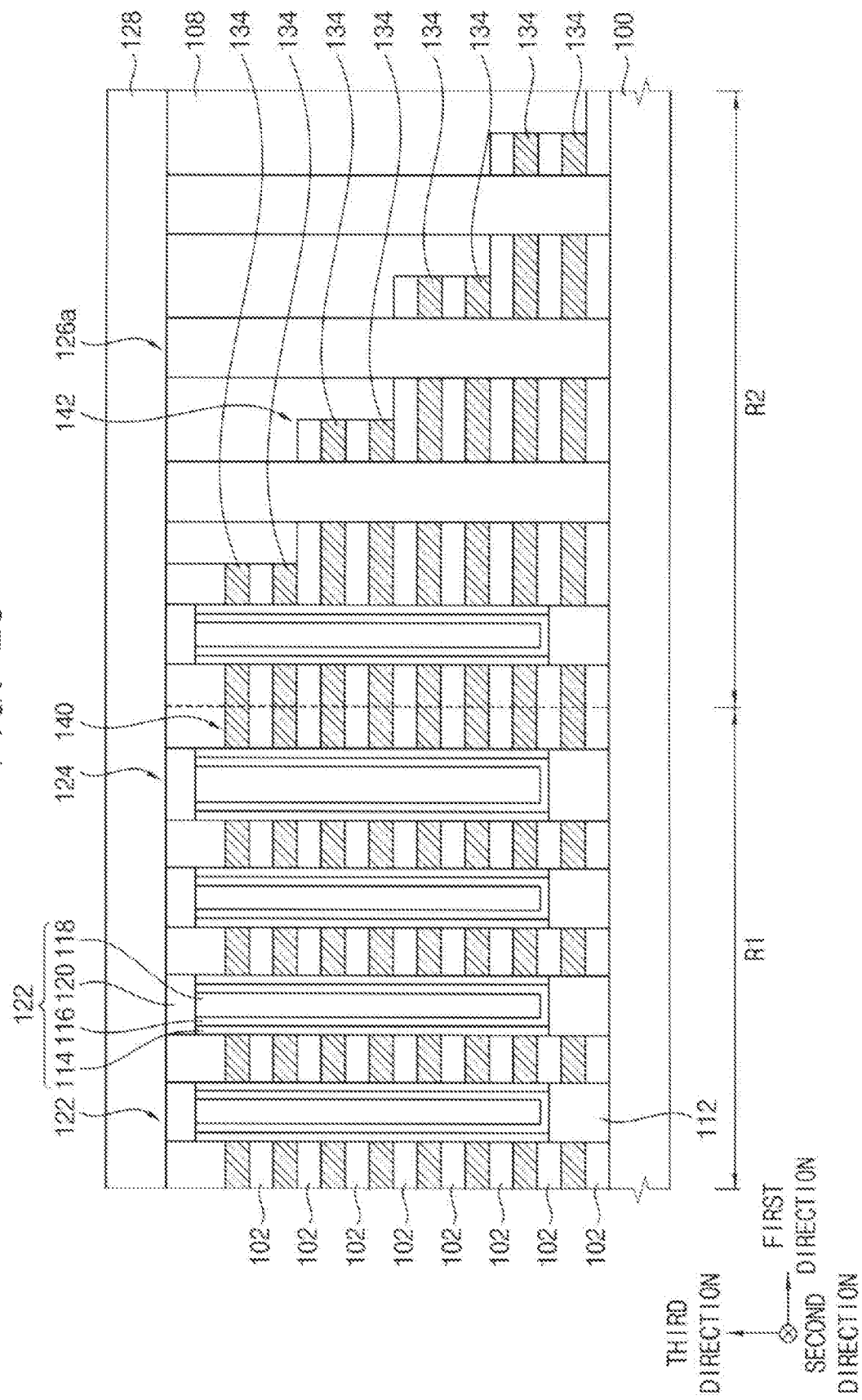
FIG. 26 is a cross-sectional view illustrating a vertical semiconductor device in accordance with an example embodiment of the present inventive concept.

FIG. 26 is a cross-sectional view illustrating a vertical semiconductor device in accordance with an example embodiment of the present inventive concept.

The vertical semiconductor device illustrated in FIG. 26 may be substantially the same as the vertical semiconductor device illustrated with reference to FIGS. 1 to 3, except for the stacked structure of the second dummy structure.

Referring to FIG. 26, the first dummy structure 124 and the channel structure 122 may have substantially the same stacked structure. The stacked structure of the second dummy structure 126a may be different from the stacked structure of each of the first dummy structure 124 and the channel structure 122.

In an example embodiment of the present inventive concept, the second dummy structure 126a may include only an insulating material, e.g., silicon oxide (SiO$_2$).

Arrangements of the second dummy structures 126a may be substantially the same as the arrangements of the second dummy structures illustrated with reference to FIGS. 1 to 3.

In an example embodiment of the present inventive concept, the vertical semiconductor device illustrated in FIG. 26 may be substantially the same as one of the vertical semiconductor devices illustrated with reference to FIGS. 4 to 14. However, the second dummy structure 126a may have a pillar shape including an insulation material.

Figure 27:
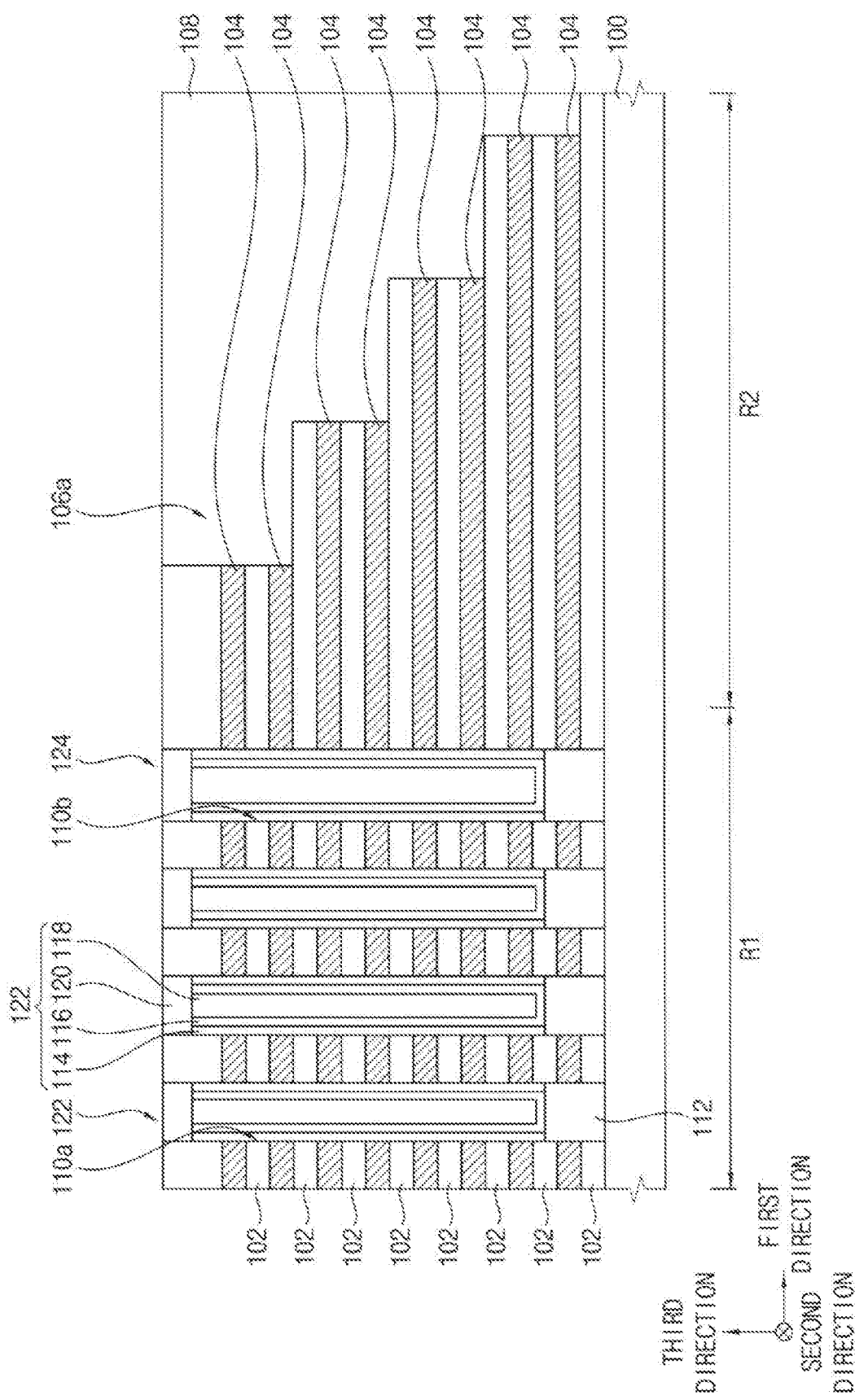
FIGS. 27 and 28 are cross-sectional views illustrating stages of a method of manufacturing a vertical semiconductor device in accordance with an example embodiment of the present inventive concept.
Figure 28:
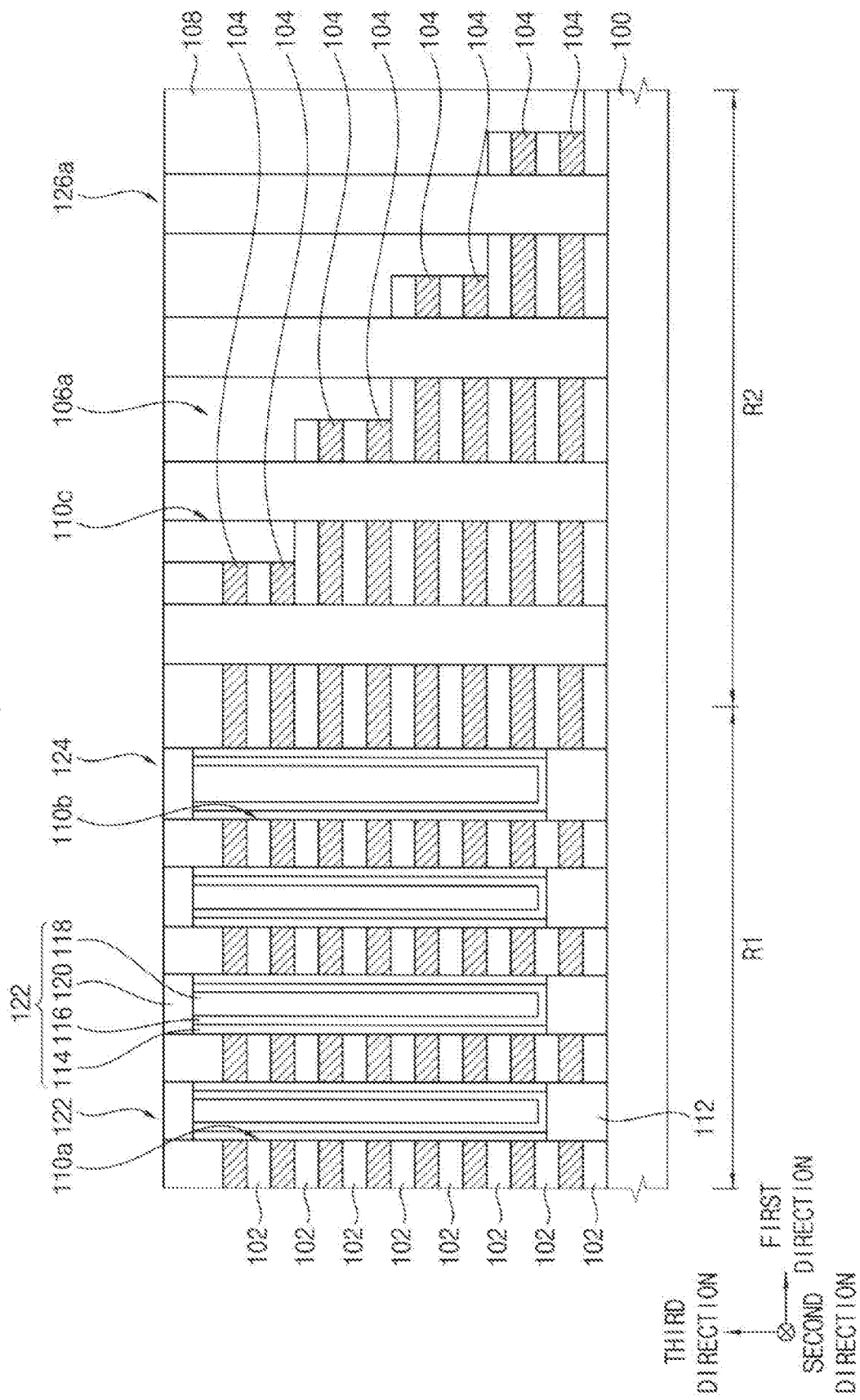

FIGS. 27 and 28 are cross-sectional views illustrating stages of a method of manufacturing a vertical semiconductor device in accordance with an example embodiment of the present inventive concept.

Referring to FIG. 27, processes illustrated with reference to FIGS. 15 to 18 may be performed on the substrate 100.

The preliminary step mold structure 106a in the first region R1 may be anisotropically etched to form a plurality of channel holes 110a and a plurality of first dummy holes 110b.

A semiconductor pattern 112 may be formed on the upper surfaces of the substrate 100 exposed by the channel hole 110a and the first dummy hole 110b. A channel structure 122 may be formed on the semiconductor pattern 112 to fill the channel hole 110a, and a first dummy structure 124 may be formed on the semiconductor pattern 112 to fill the first dummy hole 110b.

Referring to FIG. 28, the preliminary step mold structure 106a and the first upper insulating interlayer 108 in the second region R2 may be anisotropically etched to form a plurality of second dummy holes 110c. An insulation material may be formed to fill the second dummy hole 110c, and the insulation material may be planarized to form a plurality of second dummy structures 126a. The insulation material may include, e.g., silicon oxide (SiO$_2$).

Forming the channel structures 122 and the first dummy structure 124 and forming the second dummy structure 126a may be separately performed. Thus, the channel structure 122 and the first dummy structure 124 may have substantially the same stacked structure, while the second dummy structure 126a may have a stacked structure different from the stacked structure of each of the channel structure 122 and the first dummy structure 124.

The forming of the second dummy structure 126a may be performed first. In an example embodiment of the present inventive concept, after the second dummy structure 126a is formed to fill the second dummy hole 110c, the channel structure 122 and the first dummy structure 124 may be formed to fill the channel hole 110a and the first dummy hole 110b, respectively.

Processes illustrated with reference to FIGS. 22 to 25 may be performed, so that the vertical semiconductor device shown in FIG. 26 may be manufactured.

Figure 29:
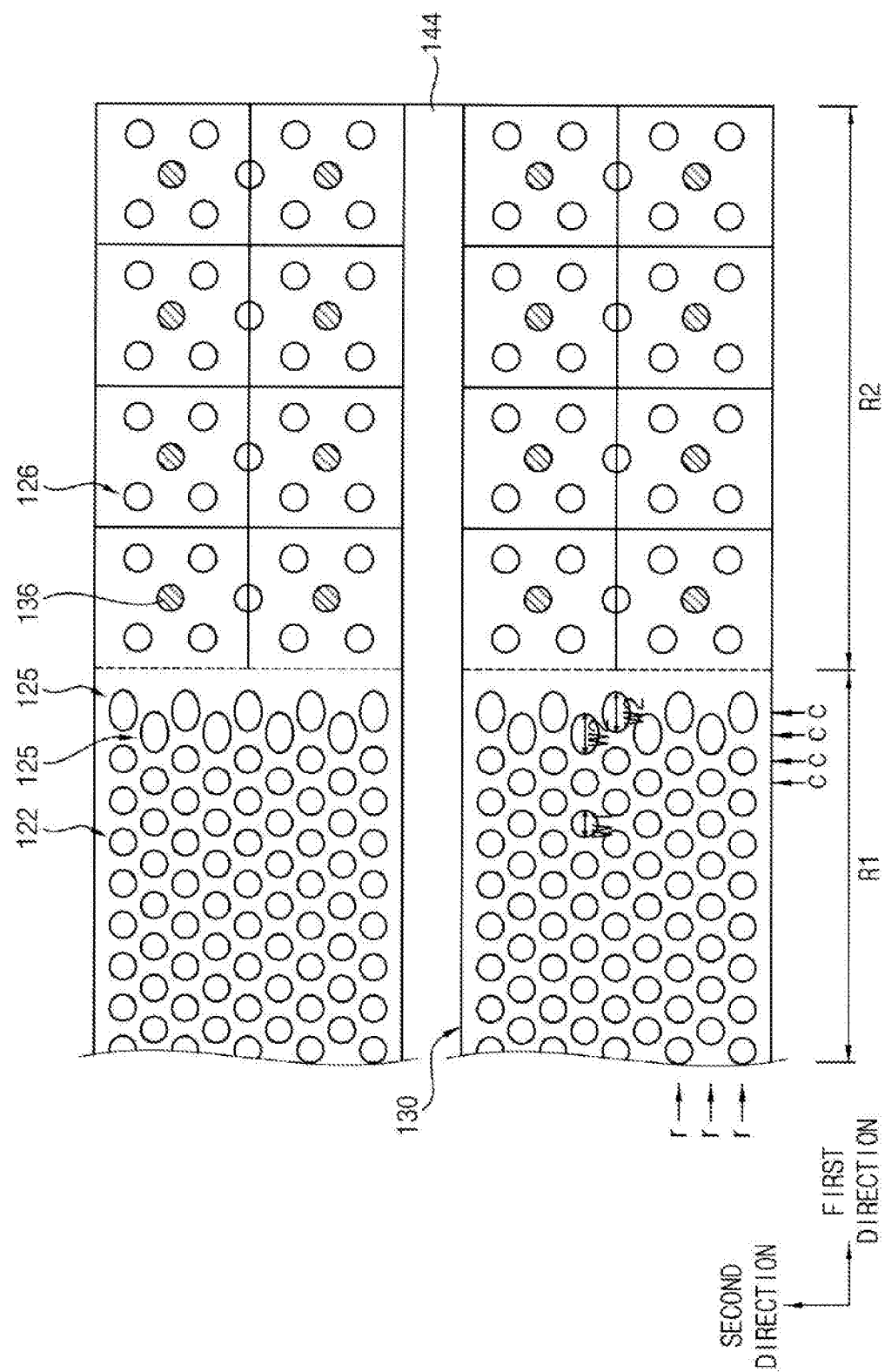
FIG. 29 is a plan view illustrating a vertical semiconductor device in accordance with an example embodiment of the present inventive concept.

FIG. 29 is a plan view illustrating a vertical semiconductor device in accordance with an example embodiment of the present inventive concept.

The vertical semiconductor device illustrated in FIG. 29 may be substantially the same as the vertical semiconductor device illustrated with reference to FIGS. 1 to 3, except for the number of columns of the first dummy structures.

Referring to FIG. 29, the first dummy structure 125 and the channel structure 122 adjacent to the first dummy structure 125 may have shapes different from each other.

A plurality of first dummy structures 125 may be arranged in the first region R1 adjacent to the second region R2. In an example embodiment of the present inventive concept, the first dummy structures 125 may be disposed at a plurality of columns in the first region R1 between a boundary of the second region R2 and a column of the channel structures 122 closest to the boundary of the second region R2. For example, as shown in FIG. 29, the first dummy structures 125 may be disposed at two columns in the first region R1 between the boundary of the second region R2 and the column of the channel structures 122 closest to the boundary of the second region R2.

The shape of the first dummy structure 125 may be substantially the same as the shape of the first dummy structure illustrated with reference to FIGS. 1 to 3. For example, an upper surface of the first dummy structure 125 may have an elliptical shape of which a major axis in the first direction is longer than a length of an upper surface of the channel structure 122. In an example embodiment of the present inventive concept, the upper surface of the first dummy structure 125 may have the second width W2 in the first direction greater than the first width W1, and have the first width W1 in the second direction. For example, the upper surface of the first dummy structure 125 may have an elliptical shape of which the major axis may have the second width W2 in the first direction, and the minor axis may have the first width W1 in the second direction.

FIG. 30 is a plan view illustrating a vertical semiconductor device in accordance with an example embodiment of the present inventive concept.

The vertical semiconductor device illustrated in FIG. 30 may be substantially the same as the vertical semiconductor device illustrated with reference to FIGS. 10 and 11, except for the number of columns of the first dummy structures.

Referring to FIG. 30, the first dummy structure 125 and the channel structure 122 adjacent to the first dummy structure 125 may have shapes different from each other.

A plurality of first dummy structures 125 may be arranged in the first region R1 adjacent to the second region R2. In an example embodiment of the present inventive concept, the first dummy structures 125 may be disposed at a plurality of columns in the first region R1 between a boundary of the second region R2 and a column of the channel structures 122 closest to the boundary of the second region R2. For example, as shown in FIG. 30, the first dummy structures 125 may be disposed at two columns on the first region R1 between the boundary of the second region R2 and the column of the channel structures 122 closest to the boundary of the second region R2.

The shape of the first dummy structure 125 may be substantially the same as the shape of the first dummy structure illustrated with reference to FIGS. 10 to 11. For example, an upper surface of the first dummy structure 125 may have rhombus shape. A long diagonal line of the rhombus may have the second width W2 in the first direction greater than the first width W1.

In an example embodiment of the present inventive concept, the first dummy structure 125 may be substantially the same as the first dummy structure of one of the vertical semiconductor devices shown in FIGS. 4 to 9 or FIGS. 12 to 14. However, the first dummy structure 125 may be disposed at two columns in the first region R1 between the boundary of the second region R2 and the column of the channel structures 122 closest to the boundary of the second region R2.

FIG. 31 is a plan view illustrating a vertical semiconductor device in accordance with an example embodiment of the present inventive concept.

The vertical semiconductor device illustrated in FIG. 31 may be substantially the same as the vertical semiconductor device illustrated with reference to FIGS. 1 and 3, except for the shape of the first dummy structure.

Referring to FIG. 31, the first dummy structure 125a and the channel structure 122 adjacent to the first dummy structure 125a may have shapes different from each other.

The first dummy structure 125a may be disposed in the first region R1 adjacent to the second region R2. An upper surface of the first dummy structure 125a may not have a regular shape. In an example embodiment of the present inventive concept, the upper surface of the first dummy structure 125a may extend in the second direction. A sidewall of the first dummy structure 125a may be curved.

When the shape of the first dummy structure 125a is different from the shape of the channel structure 122, a margin of photolithography process for forming the dummy hole may increase. Thus, failures of the dummy hole for forming the first dummy structure 125a may decrease. Also, failures of the first dummy structure 125a may decrease. When the first dummy structure 125a has reduced defects, electrical failures of the vertical semiconductor device caused by these defects may also be reduced.

FIG. 32 is a plan view illustrating a vertical semiconductor device in accordance with an example embodiment of the present inventive concept.

The vertical semiconductor device illustrated in FIG. 32 may be substantially the same as the vertical semiconductor device illustrated with reference to FIGS. 1 and 3, except for the shape of the first dummy structure.

Referring to FIG. 32, the first dummy structure 125b and the channel structure 122 adjacent to the first dummy structure 125b may have shapes different from each other.

The first dummy structure 125b may be disposed in the first region R1 adjacent to the second region R2. An upper surface of the first dummy structure 125b may not have a regular shape. In an example embodiment of the present inventive concept, the upper surface of the first dummy structure 125b may have a polygonal shape. The upper surface of the first dummy structure 125b may be greater than an upper surface of the channel structure 122. A volume of a first dummy hole for forming the first dummy structure 125b may be greater than a volume of a channel hole for forming the channel structure 122. Thus, when the first dummy hole is formed, a not-open failure of the first dummy hole may decrease. Also, failures of the first dummy structure 125b may decrease. When the first dummy structure 125b has reduced defects, electrical failures caused by these defects at the actual memory cells may also be reduced.

The foregoing is illustrative of example embodiments of the present inventive concept and is not to be construed as limiting thereof. Although a few specific example embodiments have been described, those skilled in the art will readily appreciate that many modifications are possible in the example embodiments without materially departing from the spirit and scope of the present inventive concept as defined by the appended claims.

What is claimed is:

1. A vertical semiconductor device comprising:
    a conductive pattern structure in a cell region of a substrate, the conductive pattern structure extending in a first direction;
    a pad structure in a pad region of the substrate, the pad structure contacting a side of the conductive pattern structure, and the pad structure including a plurality of steps;
    a plurality of channel structures extending through the conductive pattern structure, the plurality of channel structures spaced apart from each other in the first direction by a first distance; and
    a plurality of first dummy structures extending through the conductive pattern structure, the plurality of first dummy structures being disposed in an edge portion in the first direction of the cell region, ones of the plurality of channel structures and ones of the plurality of first dummy structures adjacent to each other in the first direction being spaced apart from each other by the first distance,
    wherein each of the plurality of channel structures has a first width in the first direction, and each of the plurality of first dummy structures has a second width in the first direction greater than the first width, and
    wherein neighboring ones of the plurality of channel structures in the first direction have a first pitch, and ones of the plurality of channel structures and ones of the plurality of first dummy structures adjacent to each other in the first direction have a second pitch greater than the first pitch.

2. The vertical semiconductor device of claim 1, wherein an upper surface of the first dummy structure has an elliptical shape.

3. The vertical semiconductor device of claim 1, wherein a maximum width in the first direction of an upper surface of the first dummy structure is greater than a maximum width in a second direction perpendicular to the first direction of the upper surface of the first dummy structure.

4. The vertical semiconductor device of claim 1, further comprising:
    a plurality of second dummy structures extending through the pad structure.

5. The vertical semiconductor device of claim 4, wherein neighboring ones of the plurality of second dummy structures in the first direction have a third pitch greater than the second pitch.

6. The vertical semiconductor device of claim 1, wherein a narrowest space between one of the plurality of first dummy structures and one of the plurality of channel structures is less than the first distance.

7. The vertical semiconductor device of claim 1, wherein the plurality of channel structures are spaced apart from each other in a second direction perpendicular to the first direction by a second distance, and the plurality of first dummy structures are spaced apart from each other in the second direction by the second distance.

8. The vertical semiconductor device of claim 1, wherein the plurality of channel structures are spaced apart from each other in a second direction perpendicular to the first direction by a second distance, and the plurality of first dummy structures are spaced apart from each other in the second direction by a third distance less than the second distance.

9. A vertical semiconductor device comprising:
    a conductive pattern structure in a cell region of a substrate, the conductive pattern structure extending in a first direction;

a pad structure in a pad region, the pad structure contacting a side of the conductive pattern structure, and the pad structure including a plurality of steps;

a plurality of channel structures extending through the conductive pattern structure;

a plurality of first dummy structures extending through the conductive pattern structure, the plurality of first dummy structures being disposed in an edge portion of the cell region; and a plurality of second dummy structures extending through the pad structure, wherein an upper surface of the first dummy structure has an elliptical shape, wherein neighboring ones of the plurality of channel structures in the first direction have a first pitch, and ones of the plurality of channel structures and ones of the plurality of first dummy structures adjacent to each other in the first direction have a second pitch greater than the first pitch, and wherein neighboring ones of the plurality of second dummy structures in the first direction have a third pitch greater than the second pitch.

10. The vertical semiconductor device of claim 9, wherein a maximum width in the first direction of the upper surface of the first dummy structure is greater than a maximum width in a second direction perpendicular to the first direction of the upper surface of the first dummy structure.

11. The vertical semiconductor device of claim 9, wherein the plurality of channel structures are spaced apart from each other in the first direction by a first distance, and ones of the plurality of channel structures and ones of the plurality of first dummy structures adjacent to each other in the first direction are spaced apart from each other by the first distance.

12. The vertical semiconductor device of claim 11, wherein a narrowest space between one of the plurality of first dummy structures and one of the plurality of channel structures is less than the first distance.

13. The vertical semiconductor device of claim 9, wherein the plurality of channel structures are spaced apart from each other in a second direction perpendicular to the first direction by a second distance, and the plurality of first dummy structures are spaced apart from each other in the second direction by the second distance.

14. The vertical semiconductor device of claim 9, wherein the plurality of channel structures are spaced apart from each other in a second direction perpendicular to the first direction by a second distance, and the plurality of first dummy structures are spaced apart from each other in the second direction by a third distance less than the second distance.

15. A vertical semiconductor device comprising:

a conductive pattern structure in a cell region of a substrate, the conductive pattern structure extending in a first direction;

a pad structure in a pad region, the pad structure contacting a side of the conductive pattern structure, and the pad structure including a plurality of steps;

a plurality of channel structures extending through the conductive pattern structure;

a plurality of first dummy structures extending through the conductive pattern structure, the plurality of first dummy structures being disposed in an edge portion of the cell region; and a plurality of second dummy structures extending through the pad structure, wherein a maximum width in the first direction of an upper surface of the first dummy structure is greater than a maximum width in a second direction perpendicular to the first direction of the upper surface of the first dummy structure, wherein neighboring ones of the plurality of channel structures in the first direction have a first pitch, and ones of the plurality of channel structures and ones of the plurality of first dummy structures adjacent to each other in the first direction have a second pitch different from the first pitch, and wherein neighboring ones of the plurality of second dummy structures in the first direction have a third pitch greater than the second pitch.

16. The vertical semiconductor device of claim 15, wherein the second pitch is greater than the first pitch.

17. The vertical semiconductor device of claim 15, wherein the plurality of channel structures are spaced apart from each other in the first direction by a first distance, and ones of the plurality of channel structures and ones of the plurality of first dummy structures adjacent to each other in the first direction are spaced apart from each other by the first distance.

18. The vertical semiconductor device of claim 15, wherein the upper surface of the first dummy structure has an elliptical shape.

19. The vertical semiconductor device of claim 17, wherein a narrowest space between one of the plurality of first dummy structures and one of the plurality of channel structures is less than the first distance.

20. The vertical semiconductor device of claim 15, wherein the plurality of channel structures are spaced apart from each other in the second direction by a second distance, and the plurality of first dummy structures are spaced apart from each other in the second direction by the second distance.

* * * * *